(12) United States Patent
Lin

(10) Patent No.: US 11,502,031 B2
(45) Date of Patent: Nov. 15, 2022

(54) MULTIPLE LAYER METAL-INSULATOR-METAL (MIM) STRUCTURE

(71) Applicant: Intel Corporation, Santa Clara, CA (US)

(72) Inventor: Kevin Lin, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 78 days.

(21) Appl. No.: 16/651,296

(22) PCT Filed: Dec. 27, 2017

(86) PCT No.: PCT/US2017/068587
§ 371 (c)(1),
(2) Date: Mar. 26, 2020

(87) PCT Pub. No.: WO2019/132897
PCT Pub. Date: Jul. 4, 2019

(65) Prior Publication Data
US 2020/0227348 A1 Jul. 16, 2020

(51) Int. Cl.
*H01L 23/522* (2006.01)
*H01L 21/768* (2006.01)
*H01L 49/02* (2006.01)

(52) U.S. Cl.
CPC .... *H01L 23/5226* (2013.01); *H01L 21/76805* (2013.01); *H01L 21/76831* (2013.01); *H01L 23/5223* (2013.01); *H01L 28/40* (2013.01)

(58) Field of Classification Search
CPC .......... H01L 23/5389; H01L 23/49822; H01L 23/49816; H01L 23/3128; H01L 23/5226;
(Continued)

(56) References Cited

U.S. PATENT DOCUMENTS 5,285,017 A 2/1994 Gardner
5,439,731 A 8/1995 Li et al.
(Continued)

FOREIGN PATENT DOCUMENTS

WO 2017111924 6/2017
WO 2017204820 11/2017

OTHER PUBLICATIONS

International Preliminary Report on Patentability from PCT/US2017/068587 dated Jul. 9, 2020, 13 pgs.
(Continued)

*Primary Examiner* — Monica D Harrison
*Assistant Examiner* — John M Parker
(74) *Attorney, Agent, or Firm* — Essential Patents Group, LLP

(57) ABSTRACT

An apparatus is provided, which includes a stack of a first plurality of layers interleaved with a second plurality of layers. In an example, the first plurality of layers includes conductive material, and the second plurality of layers includes insulating material. In an example, the first plurality of layers includes an upper layer and lower layer. A first via may extend through at least a portion of the stack, where the first via may be in contact with the upper layer and the lower layer. A second via may extend through at least a portion of the stack, where the second via may be isolated from the upper layer and lower layer.

13 Claims, 15 Drawing Sheets

(58) Field of Classification Search
CPC ......... H01L 21/76805; H01L 21/76831; H01L 28/40
See application file for complete search history.

(56) References Cited

U.S. PATENT DOCUMENTS

| | | | |
|---|---|---|---|
| 5,935,868 | A | 8/1999 | Fang et al. |
| 5,950,107 | A | 9/1999 | Huff et al. |
| 6,191,481 | B1 | 2/2001 | Bothra et al. |
| 9,391,019 | B2 | 7/2016 | Kobrinsky et al. |
| 9,786,603 | B1 | 10/2017 | Clavenger et al. |
| 10,083,863 | B1 | 9/2018 | Hsieh et al. |
| 10,141,330 | B1 | 11/2018 | Lindsay et al. |
| 2004/0071991 | A1 | 4/2004 | Atakov et al. |
| 2006/0171098 | A1 | 8/2006 | Won |
| 2007/0216030 | A1 | 9/2007 | Schindler et al. |
| 2009/0020744 | A1* | 1/2009 | Mizukami ......... H01L 21/76805 257/4 |
| 2009/0053892 | A1 | 2/2009 | Meyer et al. |
| 2009/0212350 | A1* | 8/2009 | Kidoh ................ H01L 27/0688 257/324 |
| 2009/0224365 | A1 | 9/2009 | Remmel et al. |
| 2010/0038782 | A1 | 2/2010 | Yang et al. |
| 2010/0133599 | A1* | 6/2010 | Chae ................ H01L 27/11565 257/315 |
| 2010/0164116 | A1 | 7/2010 | Li et al. |
| 2010/0224962 | A1* | 9/2010 | Kim .................... H01L 23/5228 257/536 |
| 2011/0006645 | A1 | 1/2011 | Chen et al. |
| 2011/0032659 | A1 | 2/2011 | Dunn et al. |
| 2011/0032660 | A1 | 2/2011 | Dunn et al. |
| 2012/0058640 | A1 | 3/2012 | Kim et al. |
| 2012/0156881 | A1 | 6/2012 | Haffner |
| 2012/0181701 | A1* | 7/2012 | Chen .................. H01L 23/5226 257/774 |
| 2012/0225550 | A1 | 9/2012 | Blatchford |
| 2012/0306090 | A1* | 12/2012 | Smith ............... H01L 27/11575 257/773 |
| 2013/0105948 | A1 | 5/2013 | Kewley |
| 2013/0234216 | A1 | 9/2013 | Chou et al. |
| 2014/0027922 | A1 | 1/2014 | Uzoh |
| 2014/0054535 | A1 | 2/2014 | Chen et al. |
| 2014/0248773 | A1 | 9/2014 | Tsai |
| 2014/0264740 | A1 | 9/2014 | Stribley |
| 2015/0064916 | A1 | 3/2015 | Shieh et al. |
| 2015/0108607 | A1 | 4/2015 | Chen et al. |
| 2015/0221716 | A1 | 8/2015 | Jakushokas et al. |
| 2015/0318263 | A1 | 11/2015 | Yu et al. |
| 2016/0071799 | A1 | 3/2016 | Hsieh et al. |
| 2016/0099209 | A1 | 4/2016 | Nishihara |
| 2016/0204102 | A1 | 7/2016 | Chen |
| 2016/0218059 | A1 | 7/2016 | Nakada et al. |
| 2016/0225666 | A1 | 8/2016 | Bouche et al. |
| 2016/0372369 | A1 | 12/2016 | Shaviv |
| 2017/0110402 | A1 | 4/2017 | Smith et al. |
| 2017/0352585 | A1 | 12/2017 | Burns et al. |
| 2018/0096934 | A1 | 4/2018 | Siew et al. |
| 2018/0350611 | A1 | 12/2018 | Kim et al. |
| 2019/0096759 | A1 | 3/2019 | Chang et al. |
| 2019/0139887 | A1 | 5/2019 | Lin et al. |
| 2019/0273021 | A1 | 9/2019 | Ohashi |
| 2019/0287987 | A1 | 9/2019 | Oshiki |
| 2019/0371898 | A1 | 12/2019 | Huang |
| 2020/0006261 | A1 | 1/2020 | Lin |
| 2020/0013900 | A1 | 1/2020 | Carr et al. |
| 2020/0066521 | A1 | 2/2020 | Lin et al. |
| 2020/0075618 | A1 | 3/2020 | Oike |
| 2020/0152502 | A1 | 5/2020 | Hsu |
| 2020/0194376 | A1 | 6/2020 | Naylor et al. |
| 2020/0219804 | A1 | 7/2020 | Jezewski et al. |
| 2020/0227348 | A1 | 7/2020 | Lin |
| 2020/0303246 | A1 | 9/2020 | Varghese et al. |
| 2021/0118851 | A1* | 4/2021 | Richards ............. H01L 25/0652 |

OTHER PUBLICATIONS

International Search Report and Written Opinion from PCT/US2017/068587 dated Sep. 18, 2018, 16 pgs.

* cited by examiner

MULTIPLE LAYER METAL-INSULATOR-METAL (MIM) STRUCTURE

CLAIM OF PRIORITY

This Application is a National Stage Entry of, and claims priority to, PCT Application No. PCT/US2017/068587, filed on Dec. 27, 2017 and titled "MULTIPLE LAYER METAL-INSULATOR-METAL (MIM) STRUCTURE", which is incorporated by reference in its entirety for all purposes.

BACKGROUND

Integrated circuit chips often also include passive components, such as capacitors, resistors, inductors, etc. Metal-Insulator-Metal (MIM) capacitor is a passive component that may be used in many applications, such as Radio Frequency (RF) applications, in analog integrated circuits, etc. MIM capacitors have attracted great attention because of their high capacitance density that supplies small areas, increases circuit density, and further reduces the fabrication cost.

In a conventional MIM with multiple conductive layers, the conductive layers may be horizontal or laterally offset with respect to each other, e.g., so that the vias can connect to the respective conductive layers. For example, multiple masks may be used for form the multiple conductive layers, which may increase the cost and/or time to form the multiple conductive layers. Also, as the multiple conductive layers may be offset, this may increase an area to form the multiple conductive layers.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
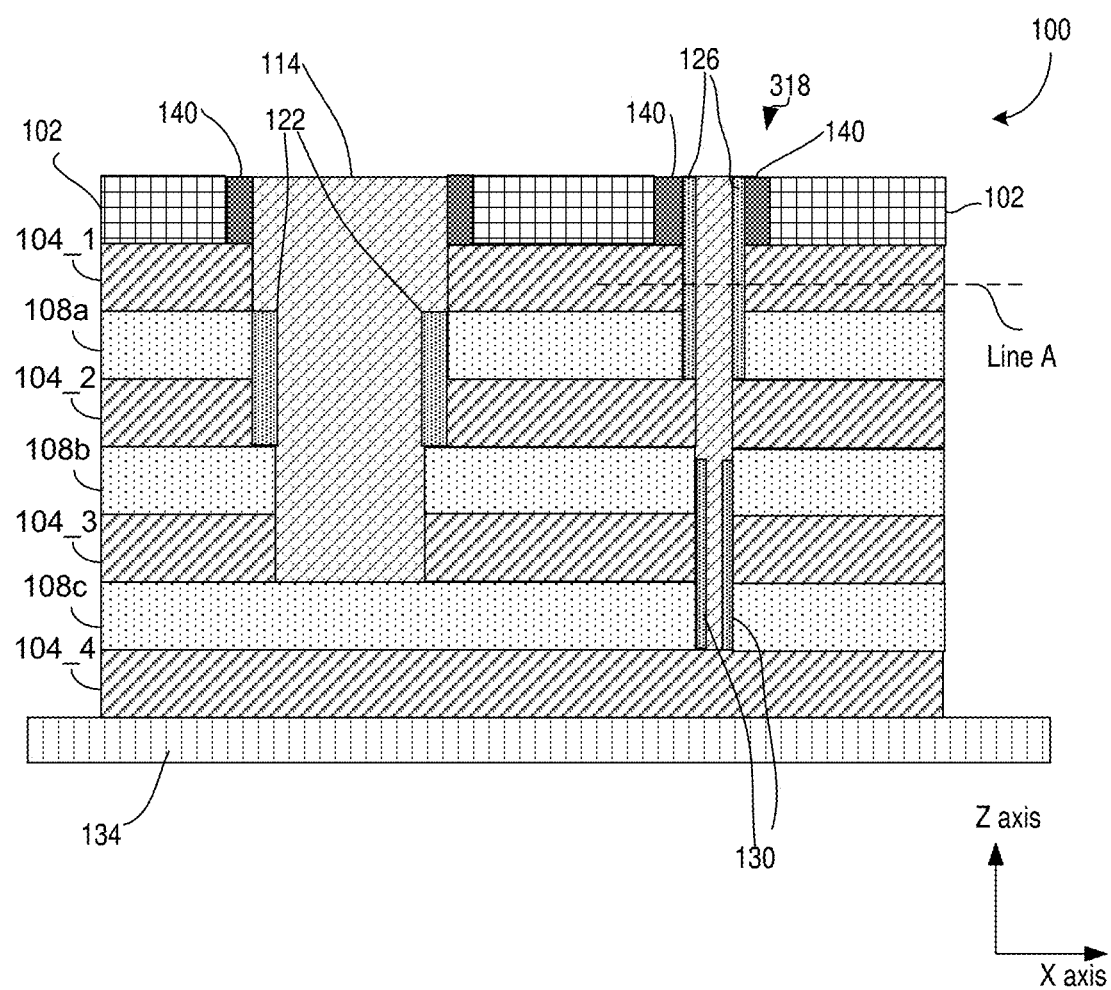
FIG. 1 illustrates a MIM including a first via coupled to odd numbered conductive layers, and a second via coupled to even numbered conductive layers, according to some embodiments.

MIM capacitors are a particular type of capacitor, having a top metal plate and a bottom metal plate separated by a capacitor dielectric, which are often implemented in integrated circuits. In an example, a MIM capacitor may have multiple stacked conductive layers, each separated from an adjacent one by an insulator layer.

In some embodiments, the MIM capacitor has two vias formed through the multiple stacked conductive layers. For example, a first via may be coupled to first one or more of the multiple stacked conductive layers (e.g., to even numbered conductive layers), and a second via may be coupled to second one or more of the multiple stacked conductive layers (e.g., to odd numbered conductive layers). As discussed in further detail herein, forming the MIM capacitor with multiple stacked conductive layers in such a manner may result in using a single mask to form the stacks of conductive layers and insulating layers.

As discussed herein, the conductive layers need not be offset (e.g., may be aligned, and may have similar length and width). For example, a single mask may be used to form the stacks of conductive layers and insulating layers. Using a single mask to form the stacks of conductive layers and insulating layers may result in cost, time and/or area improvements. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 illustrates a MIM 100 including a first via 114 coupled to odd numbered conductive layers 104_1, 104_3, and a second via 118 coupled to even numbered conductive layers 104_2, 104_4, according to some embodiments. In some embodiments, the MIM 100 includes the conductive layers 104_1, 104_2, 104_3, 104_4, and insulating layers 108a, 108b, 108c.

Elements referred to herein with a common reference label followed by a particular number or alphabet may be collectively referred to by the reference label alone. For example, conductive layers 104_1, 104_2, 104_3, 104_4 may be collectively and generally referred to as conductive layers 104 in plural, and conductive layer 104 in singular. Similarly, insulating layers 108a, 108b, 108c may be collectively and generally referred to as insulating layers 108 in plural, and insulating layer 108 in singular.

In some embodiments, the conductive layers 104 and the insulating layers 108 are stacked in an interleaved arrangement. Thus, in some embodiments, an insulating layer 108 separates two vertically (e.g., z-axis in FIG. 1) adjacent conductive layers 104. For example, the insulating layer 108a may separate adjacent conductive layers 104_1 and 104_2.

In some embodiments, the conductive layers 104 includes conductive material such as, but not limited to, one or more of platinum (Pt), aluminum-copper (AlCu), titanium nitride (TiN), gold (Au), titanium (Ti), tantalum (Ta), tantalum nitride (TaN), tungsten (W), tungsten nitride (WN), copper (Cu), and/or the like. For example, the conductive layers 104 may include any appropriate conductive material that may be subtractively etched. In some embodiments, the insulating layers 108 includes insulating or dielectric material, such as, but not limited to, one or more of nickel oxide (NiO), titanium oxide (TiO), hafnium oxide (HfO), zirconium oxide (ZrO), zinc oxide (ZnO), tungsten oxide (WO3), aluminum oxide (Al2O3), tantalum oxide (TaO), molybdenum oxide (MoO), copper oxide (CuO), silicon dioxide (SiO2), silicon nitride (Si3N4), polymide, and/or the like.

In some embodiments, the conductive layers 104 is identified as odd numbered conductive layers and even numbered conductive layers. For example, the conductive layers 104_1, 104_3 may be odd numbered conductive layers, and the conductive layers 104_2, 104_2 may be even numbered conductive layers.

In some embodiments, the MIM 100 is over a substrate 134, and the side of the MIM 100 nearest the substrate 134 is referred to as a bottom side of the MIM 100. A top side of the MIM 100 may be opposite the bottom side. In an example, a top most conductive layer 104 on the top side of the MIM 100 (e.g., the conductive layer 104_1) may be an odd numbered conductive layer. Other conductive layers 104 may be referred to as odd or even numbered conductive layers, e.g., based on a position of the conductive layers relative to the top most conductive layer 104_1. Thus, for example, the second top most conductive layer 104_2 may be an odd numbered conductive layer, the third top most conductive layer 104_3 may be an even numbered conductive layer, and so on.

Although FIG. 1 illustrates four conductive layers (e.g., two even and two odd numbered conductive layers), in some embodiments, the principles of this disclosure can be applied to form a MIM including N number of conductive layers 104, where N can be 2, 3, 4, 5, or any appropriate higher integer (e.g., N=4 in FIG. 1). Thus, in an example, N≥2. In some embodiments, there are at least one odd numbered conductive layer 104 and at least one even numbered conductive layer 104 (e.g., N≥2 in such an example) in the MIM.

In some embodiments, the MIM 100 has a via 114 that extends through at least some of the conductive layers 104 and insulating layers 108. For example, the via 114 may extend through the conductive layers 104_1, 104_2 and 104_3, and the insulating layers 108a and 108b. In some embodiments, the via 114 is coupled to (e.g., in direct contact with and attached to) the conductive layers 104_1 and 104_3. In some embodiments, although the via 114 extends through the conductive layer 104_2, the via 114 is in contact with, or connected, attached or coupled to, the conductive layer 104_2. For example, one or more spacers 122 may isolate (e.g., physically and/or electrically isolate) the via 114 from the conductive layer 104_2. For example, the spacers 122 may act as a blocking layer to block or isolate the via 114 from the conductive layer 104_2. For example, the spacer 122 may be between a sidewall of the conductive layer 104_2 and a portion of the via 114 that extends through the conductive layer 104_2. Thus, in some embodiments, the via 114 is coupled to the odd numbered conductive layers 104_1, 104_3, while being isolated from the even numbered conductive layers 104_2, 104_4.

In some embodiments, the MIM 100 includes a via 118 that is formed through at least some of the conductive layers 104 and insulating layers 108. For example, the via 118 may be formed through the conductive layers 104_1, 104_2 and 104_3 (and may be in contact with, or formed through, the conductive layer 104_4), and the insulating layers 108a, 108b, and 108c. In some embodiments, the via 118 is coupled to (e.g., in direct contact with and attached to) the conductive layers 104_2 and 104_4. In some embodiments, although the via 114 may be formed through the conductive layers 104_1 and 104_3, the via 114 may not be in contact with, attached, connected or coupled to, the conductive layers 104_1 and 104_3. For example, one or more spacers 126 may isolate (e.g., physically and/or electrically isolate) the via 118 from the conductive layer 104_1, and one or more spacers 130 may isolate (e.g., physically and/or electrically isolate) the via 118 from the conductive layer 104_3. For example, the spacers 122, 130 may act as blocking layers to block or isolate the via 114 from the conductive layers 104_1 and 104_3, respectively. For example, the spacer 126 may be between a sidewall of the conductive layer 104_1 and a portion of the via 118 that extends through the conductive layer 104_1. For example, the spacer 130 may be between a sidewall of the conductive layer 104_3 and a portion of the via 118 that extends through the conductive layer 104_3. In some embodiments, the via 118 is coupled to the even numbered conductive layers 104_2, 104_4, while being isolated from the odd numbered conductive layers 104_1, 104_3.

In some embodiments, the spacers 122, 126, 130 includes any dielectric or insulating material, e.g., which may insulate a conductive layer 104 from a corresponding one of the vias 114 or 118. For example, the spacers 122, 126, 130 includes material such as, but not limited to, one or more of nickel oxide (NiO), titanium oxide (TiO), hafnium oxide (HfO), zirconium oxide (ZrO), zinc oxide (ZnO), tungsten oxide (WO3), aluminum oxide (Al2O3), tantalum oxide (TaO), molybdenum oxide (MoO), copper oxide (CuO), silicon dioxide (SiO2), silicon nitride (Si3N4), polyimide, and/or the like. In some embodiments, the top most conductive layer 104_1 is at least in part covered by hard mask layers 102, 140, as illustrated in FIG. 1.

Figure 2A:
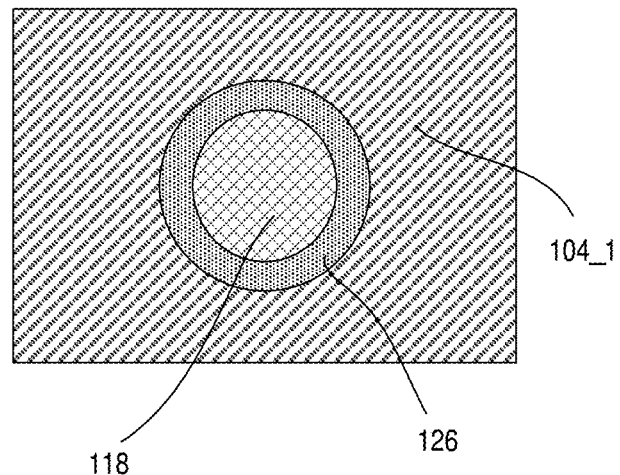
FIG. 2A illustrates a plan view of a via surrounded by a spacer, according to some embodiments.

FIG. 2A illustrates a plan view of the via 118 surrounded by the spacer 126, according to some embodiments. For example, the plan view of FIG. 2A may be along the line A of FIG. 1. As illustrated in FIG. 2A, the spacer 126 may isolate the via 118 from the conductive layer 104_1. For example, the spacer 126 may be between a sidewall of the conductive layer 104_1 and a portion of the via 118 that extends through the conductive layer 104_1. Although plan views of other spacers 122 and 130 are not illustrated in FIG. 2A, the plan view of the spacers 122 and 130 would be apparent to those skilled in the art from FIG. 2A.

Referring again to FIG. 1, in some embodiments, one or more of the conductive layers 104 and/or one or more of the insulating layers 108 (e.g., all the conductive layers 104 and all the insulating layers 108) has similar dimensions (e.g., similar length and width, although the height may be different). For example, as discussed herein later, in some embodiments, the conductive layers 104 and the insulating layers 108 are formed using a common masking process, because of which the conductive layers 104 and the insulating layers 108 may has similar dimensions (e.g., a periphery of the conductive layers 104 and the insulating layers 108 may have similar shape, size and/or dimensions).

In some embodiments, at least a section of the via 114 has a larger cross-sectional diameter or perimeter than that of the via 118. For example, a dimension of the via 114 (e.g., where the via 114 passes through the top most conductive layer 104_1) may be more than that of the via 118 (e.g., where the via 118 passes through the top most conductive layer 104_1). For example, a diameter or width of the via 114 (e.g., where the via passes through the top most conductive layer 104_1) may be at least double or more than that of the via 118 (e.g., where the via 118 passes through the top most conductive layer 104_1). In some embodiments, such difference in the dimensions of the vias 114 and 118 facilitates the formation of the vias 114 and 118, as discussed herein in further details.

The via 118 has a first portion with a first diameter that extends through the conductive layer 104_1 (e.g., is adjacent to the spacers 126); the via 118 has a second portion with a second diameter that extends through the conductive layer 104_2; and the via 118 has a third portion with a third diameter that extends through the conductive layer 104_3 (e.g., is adjacent to the spacers 130). In some embodiments, the second diameter is smaller than the first diameter by at least twice a thickness of the spacer 126. In some embodiments, the third diameter is smaller than the second diameter by at least twice a thickness of the spacer 130.

Figure 2B:
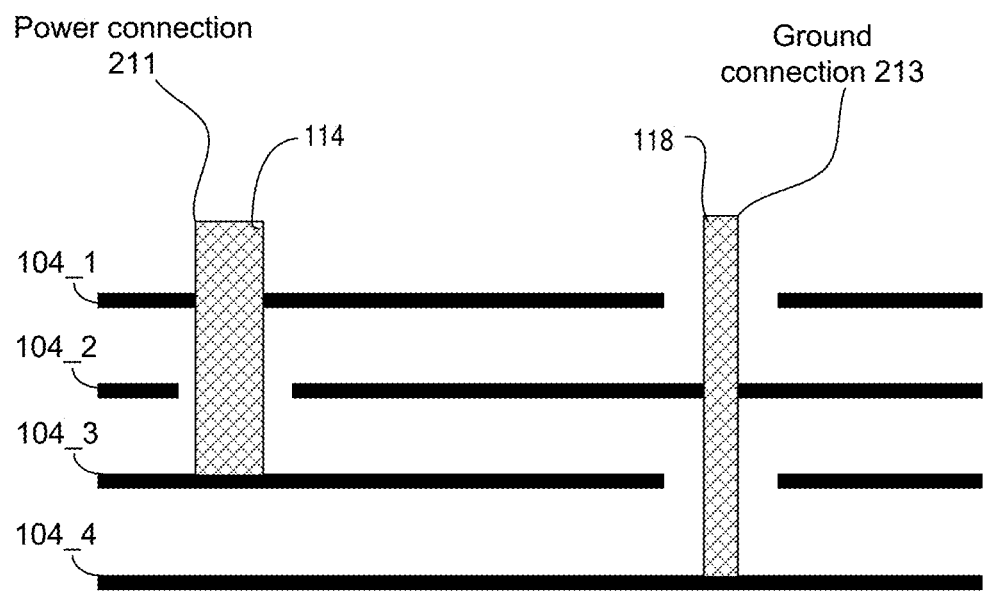
FIG. 2B schematically illustrates some of the connections of the MIM of FIG. 1, according to some embodiments.

FIG. 2B schematically illustrates example connections of the MIM 100 of FIG. 1, according to some embodiments. For example, the conductive layers 104 and the vias 114, 118 are illustrated, while the spacers 122, 126, 130 and the insulating layers 108 are not illustrated in FIG. 2B for purposes of illustrative clarity. In FIG. 2B, the space between the via 114 and the conductive layer 104_2 symbolically indicates that the via 114 is electrically isolated from the conductive layer 104_2. Similarly, FIG. 2B also symbolically indicates that the via 118 is electrically isolated from the conductive layers 104_1 and 104_3.

In some embodiments, one of a power or ground connection is coupled to the via 114, and another of the power or ground connection is coupled to the via 118. In the example of FIG. 2B, a power connection 211 is coupled to the via 114, and a ground connection 213 is coupled to the via 118. Because of the gap between the conductive layers 104, capacitance may be formed between the terminals represented by the vias 114 and 118. Accordingly, in some embodiments, the MIM 100 is used as a capacitor device.

Figure 3A:
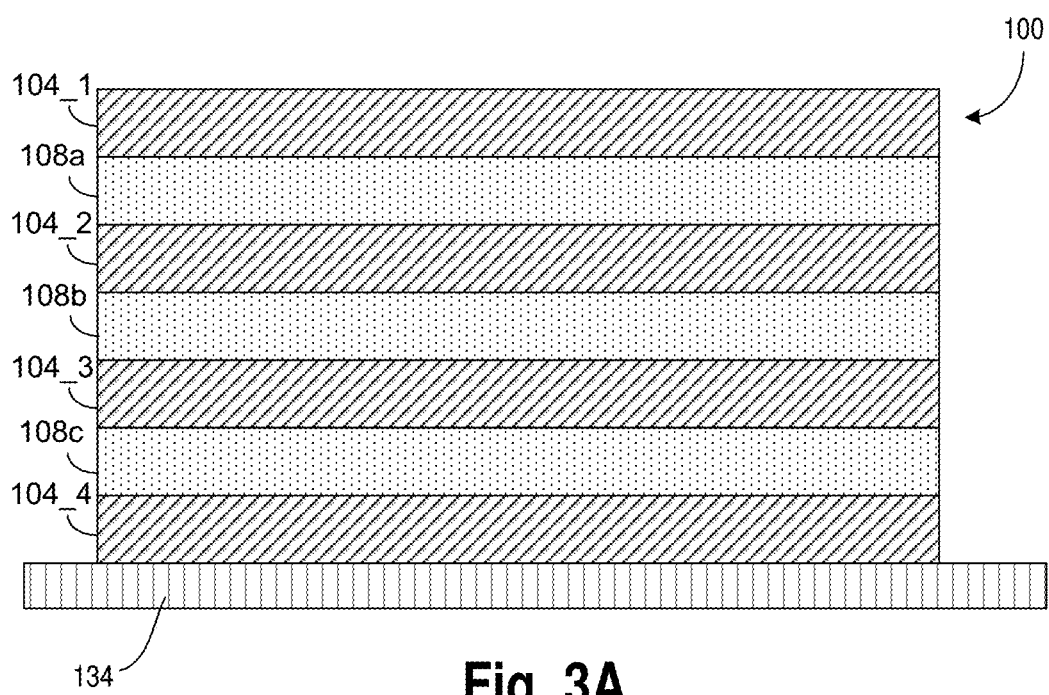
FIGS. 3A, 3B, 3C, 3D, 3E, 3F, 3G, 3H, 3I, 3J, 3K, 3L, 3M, 3N, 3O, 3P, 3Q, 3R, and 3S illustrate an example process for formation of the MIM of FIG. 1, according to some embodiments.
Figure 3B:
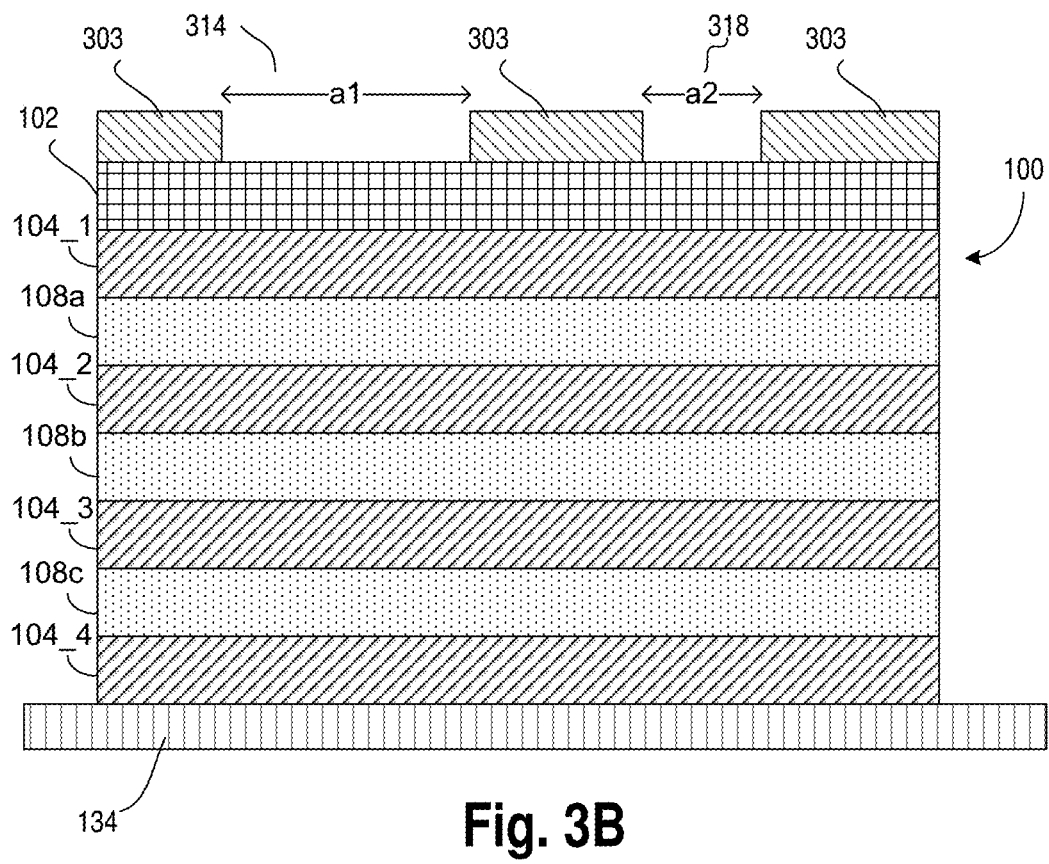
Figure 3C:
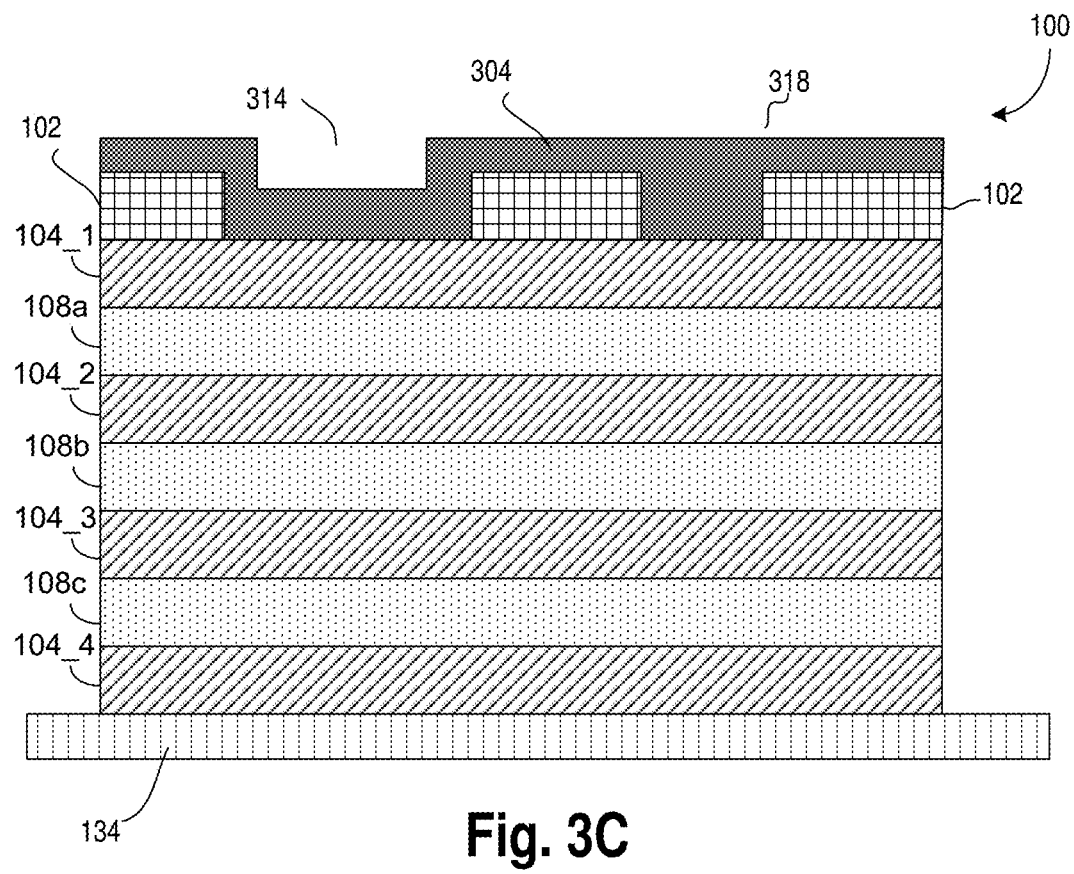
Figure 3D:
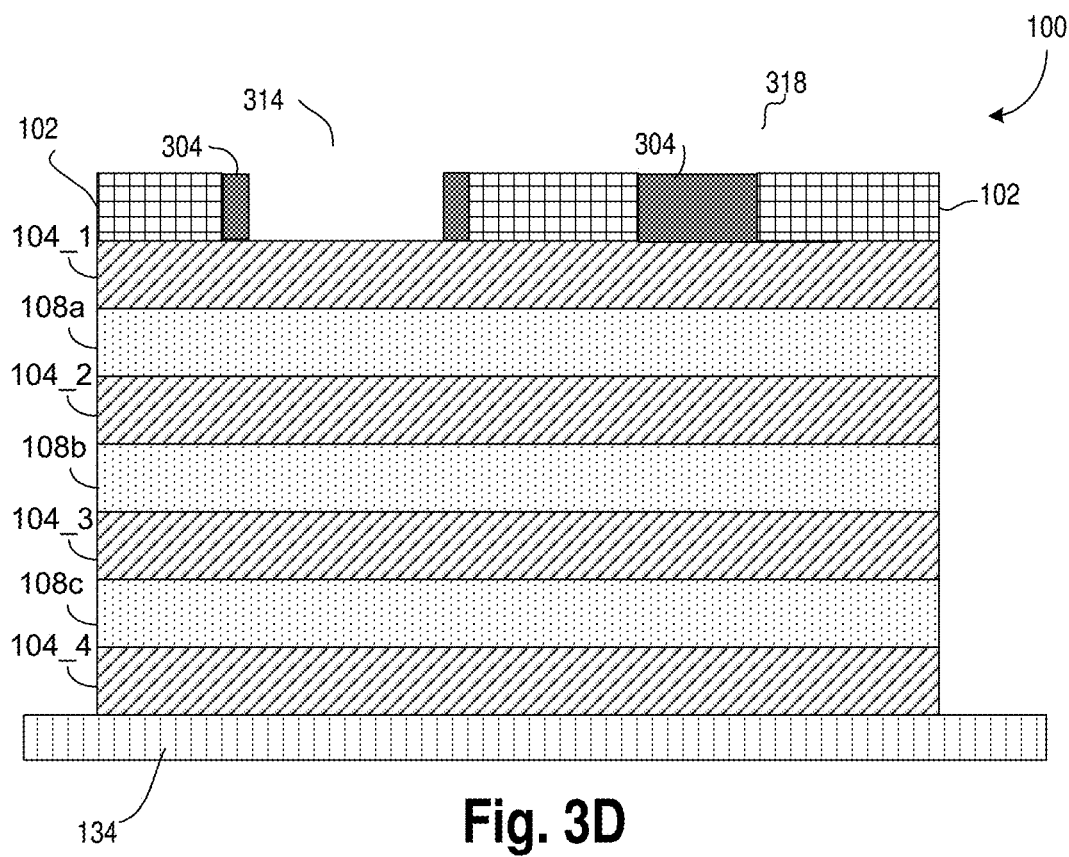
Figure 3E:
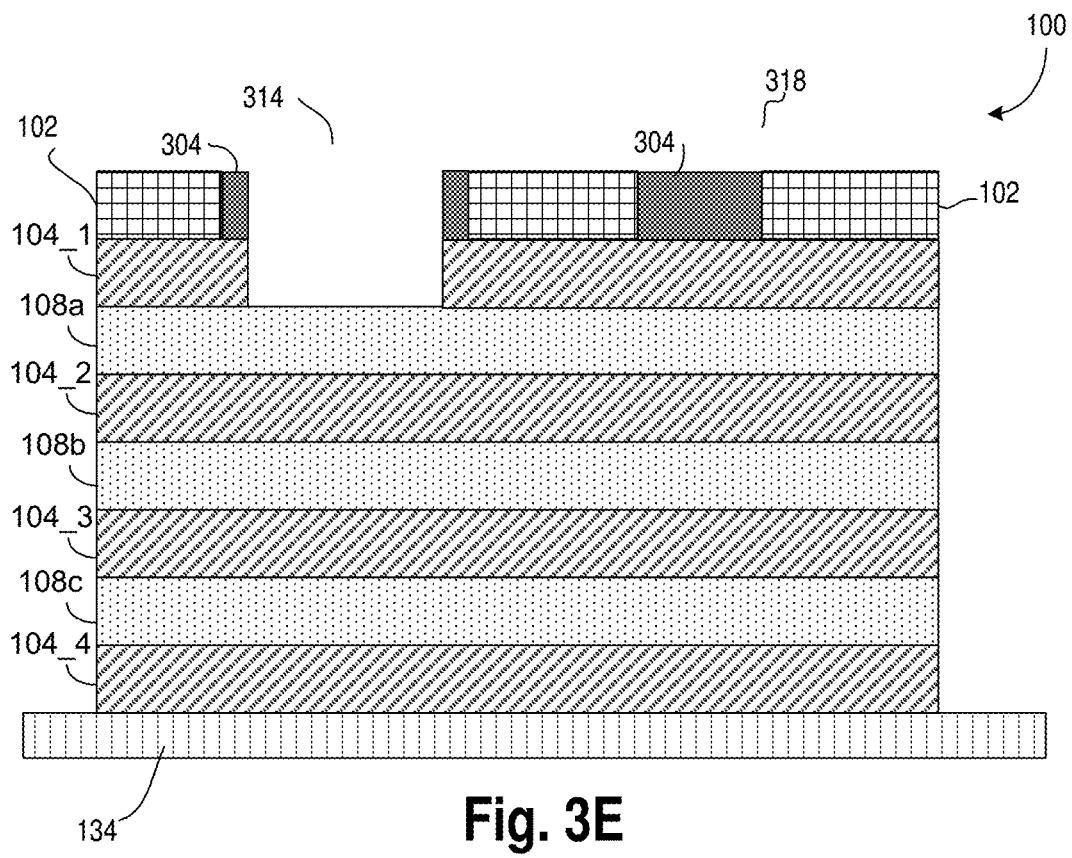
Figure 3F:
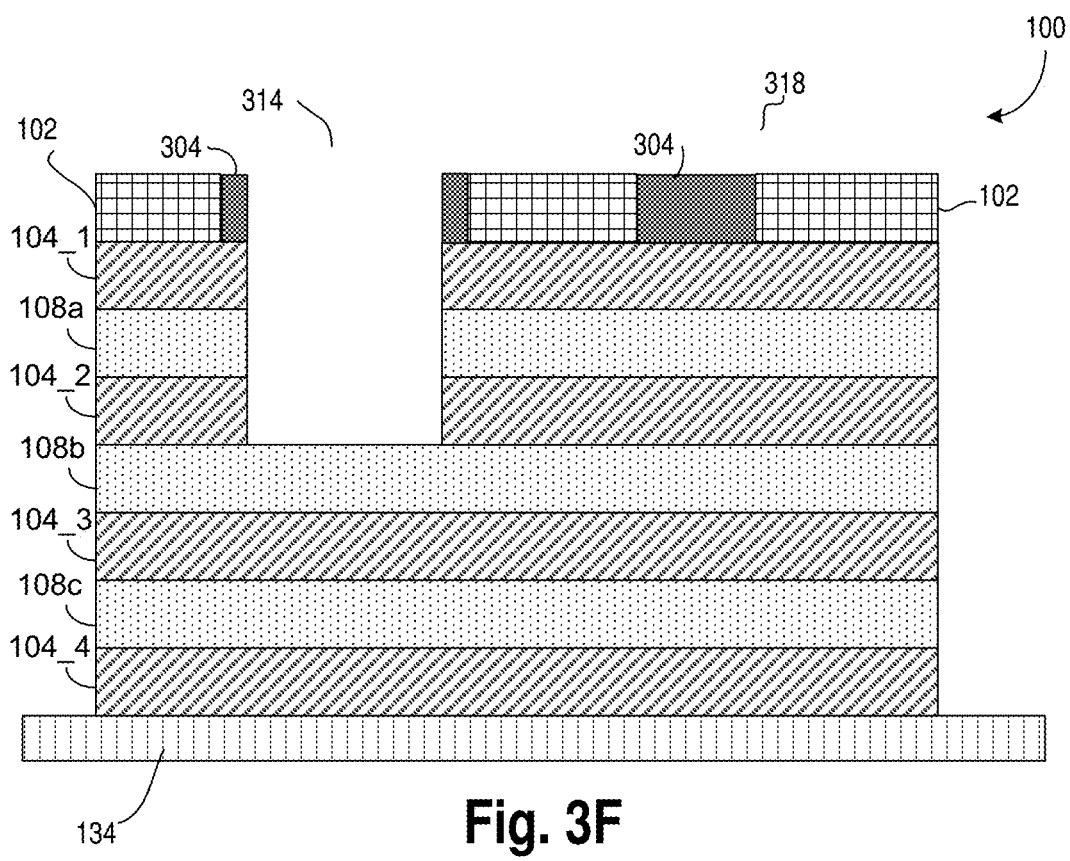
Figure 3G:
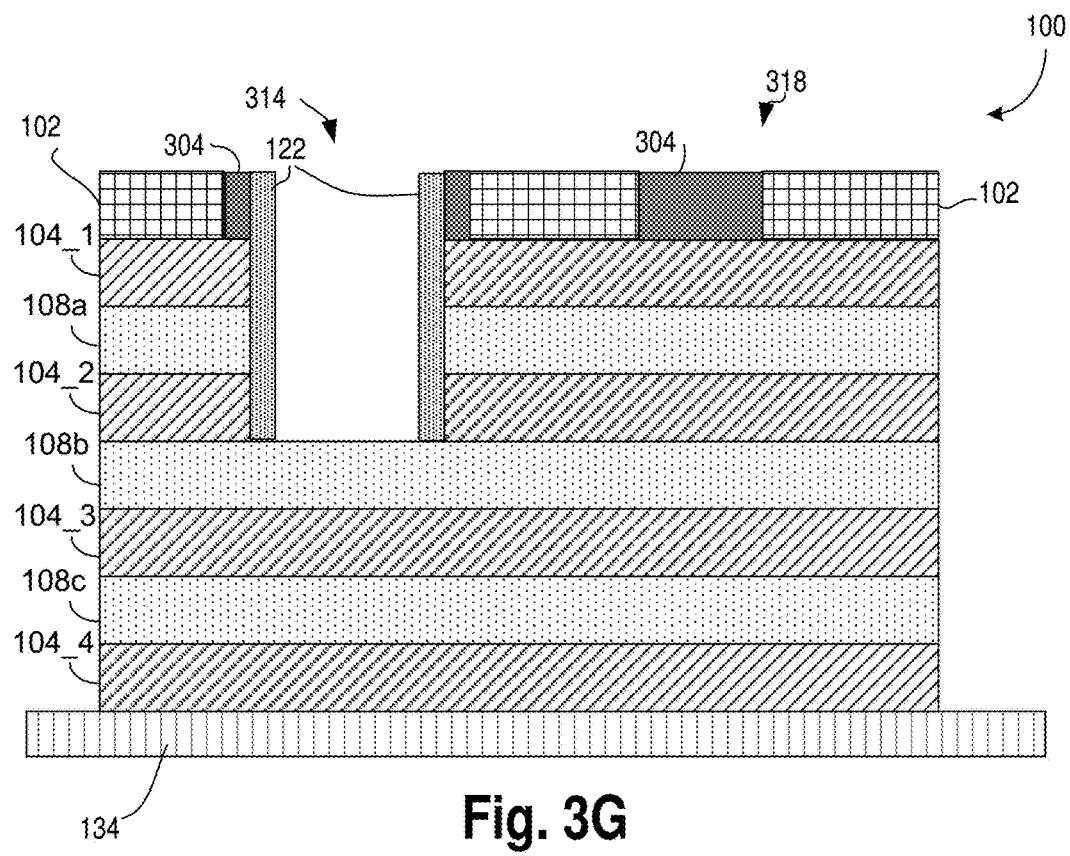
Figure 3H:
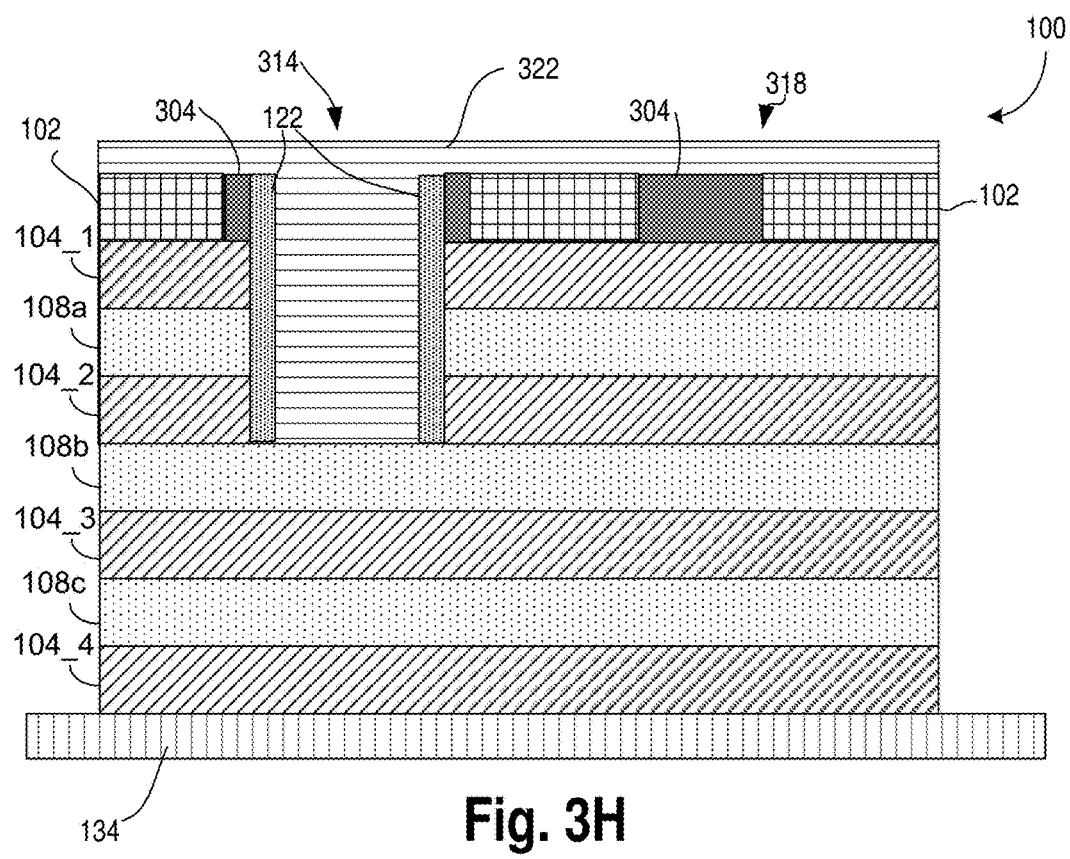
Figure 3I:
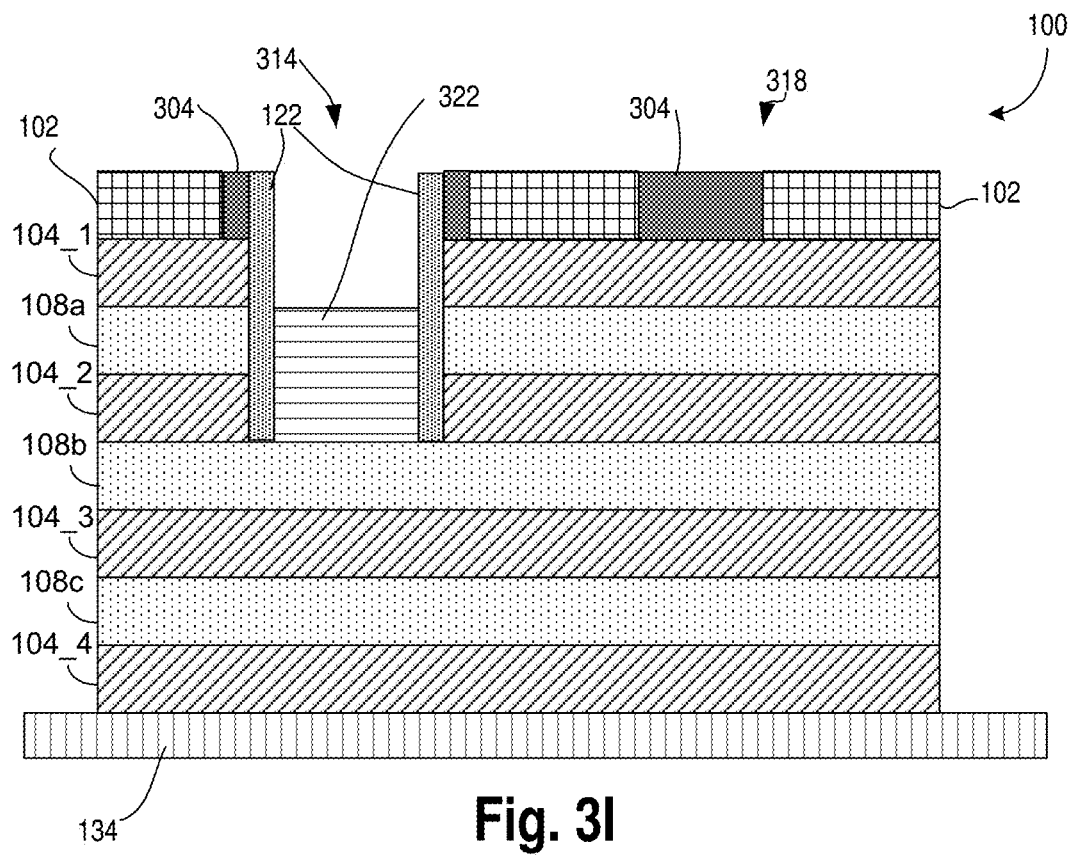
Figure 3J:
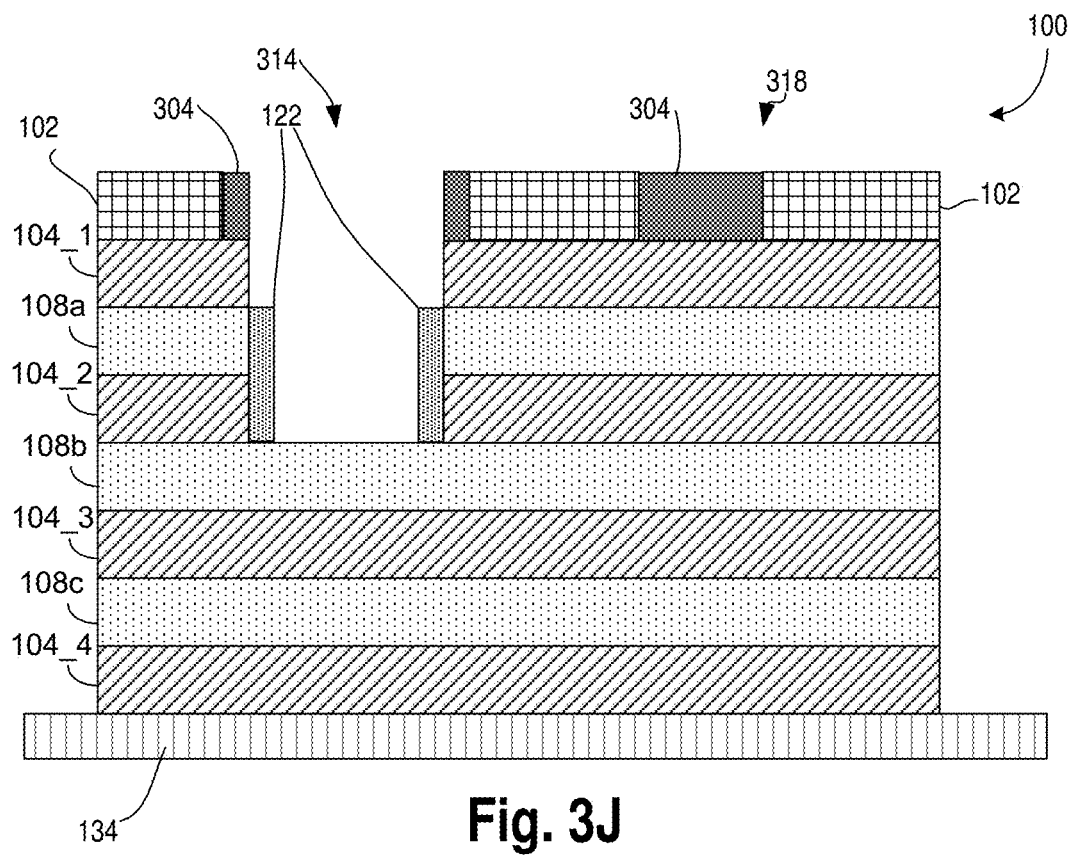
Figure 3K:
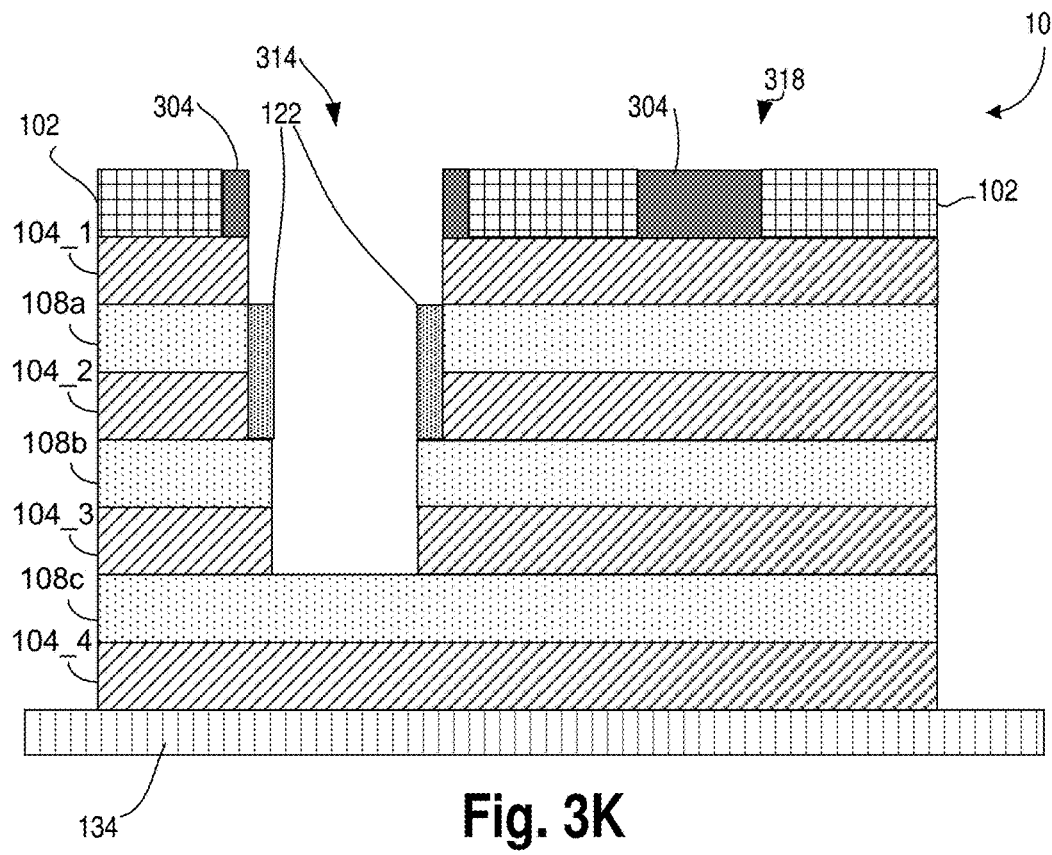
Figure 3L:
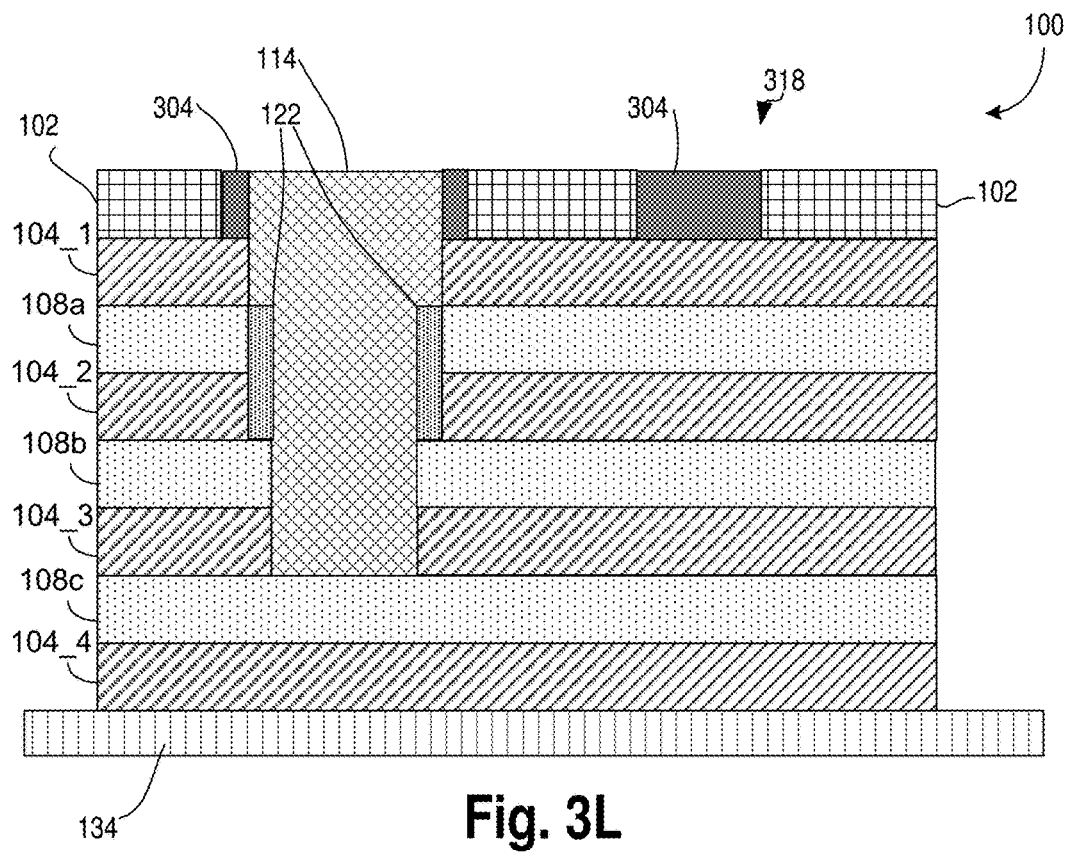
Figure 3M:
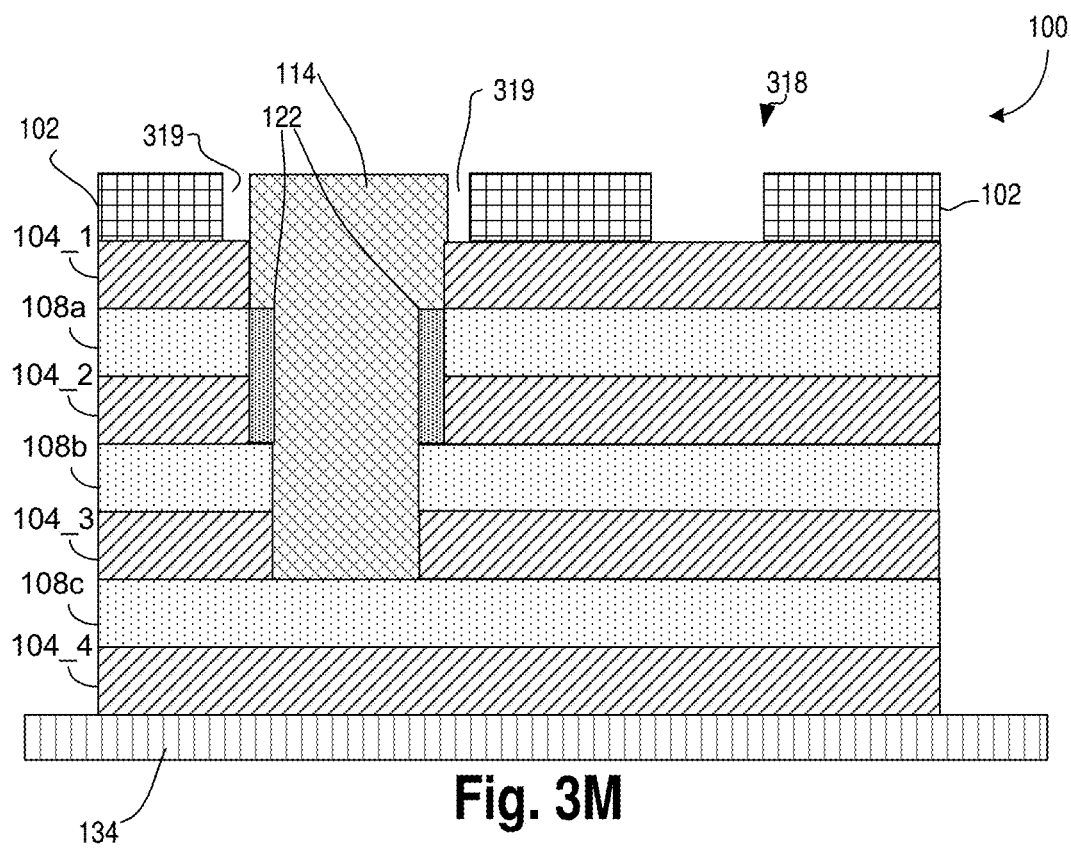
Figure 3N:
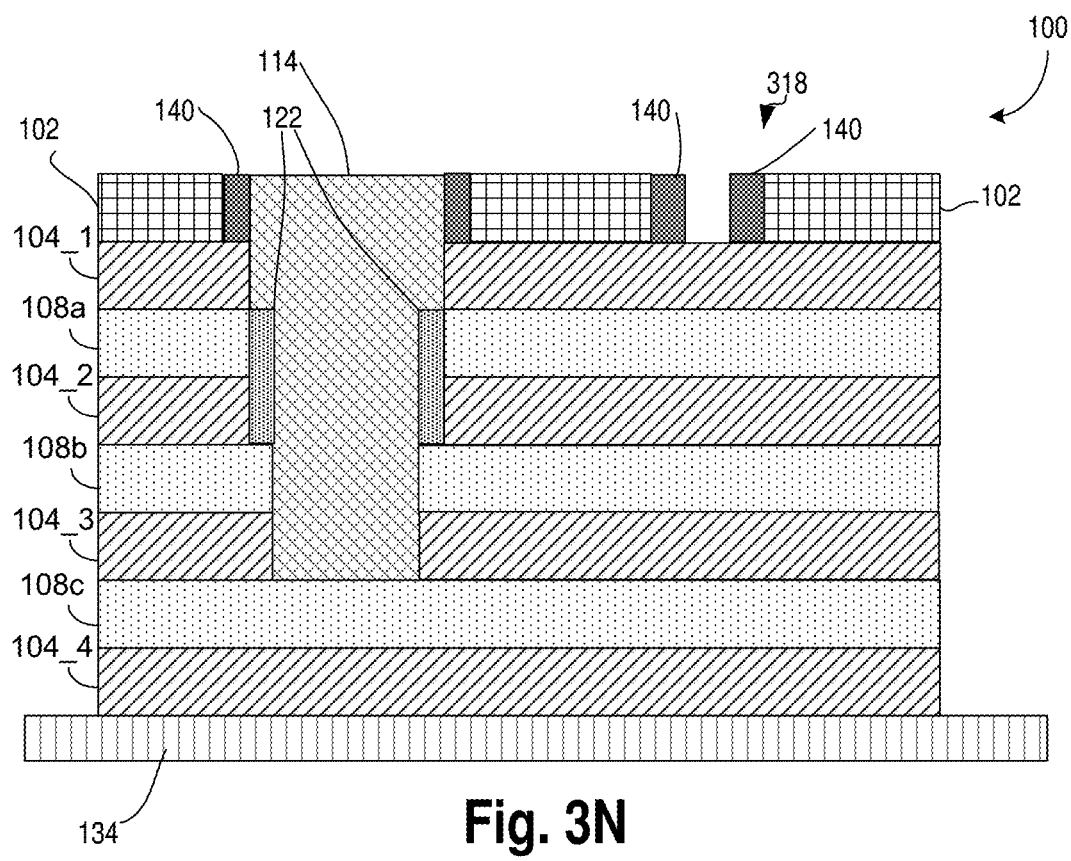
Figure 3O:
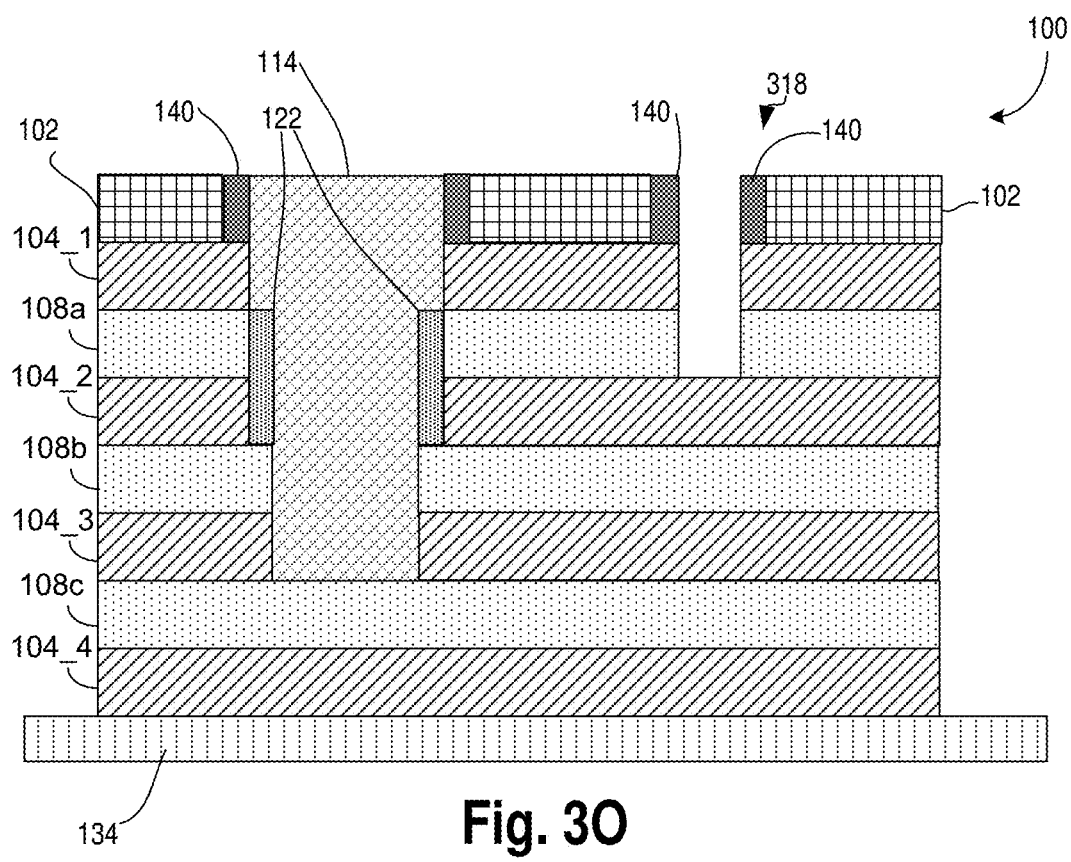
Figure 3P:
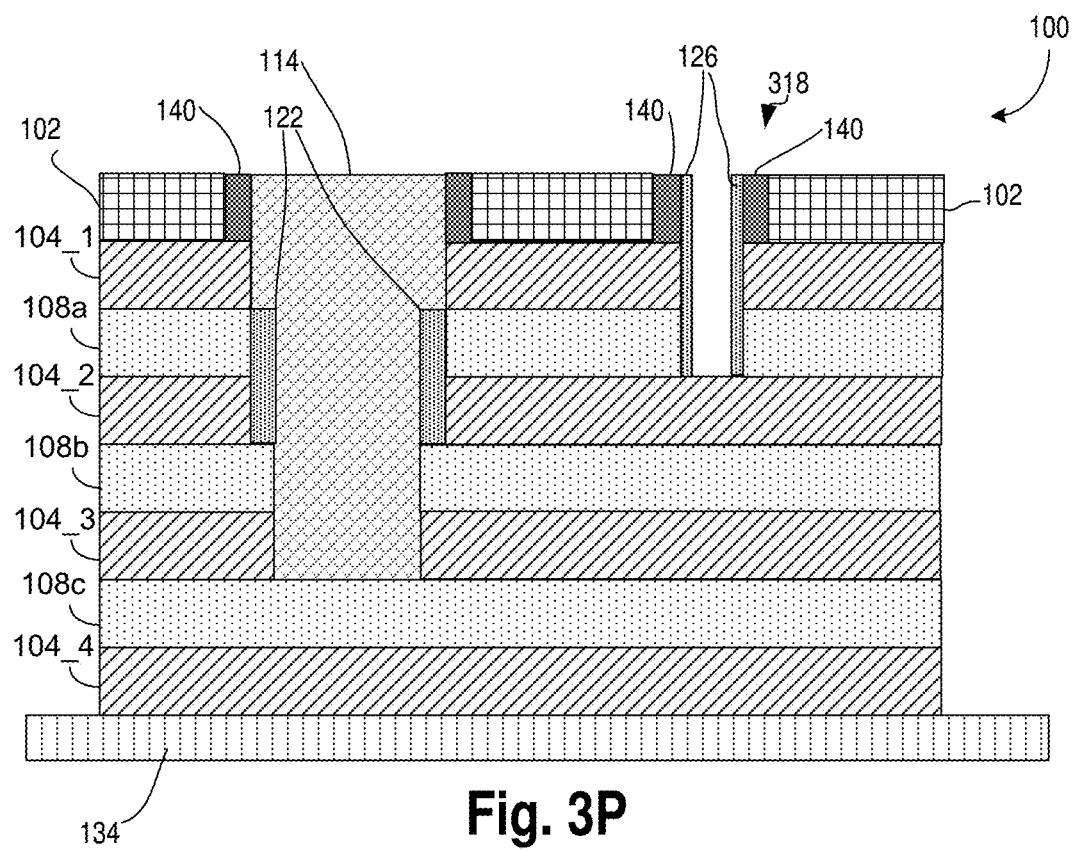
Figure 3Q:
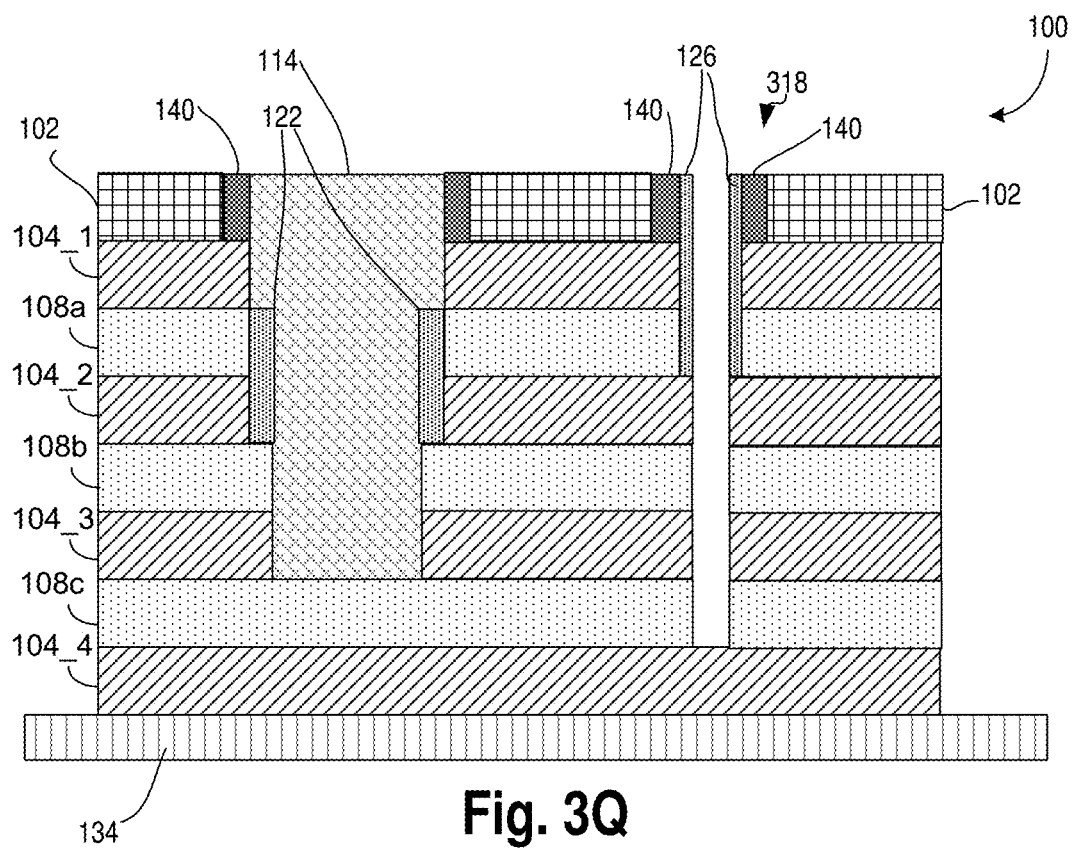
Figure 3R:
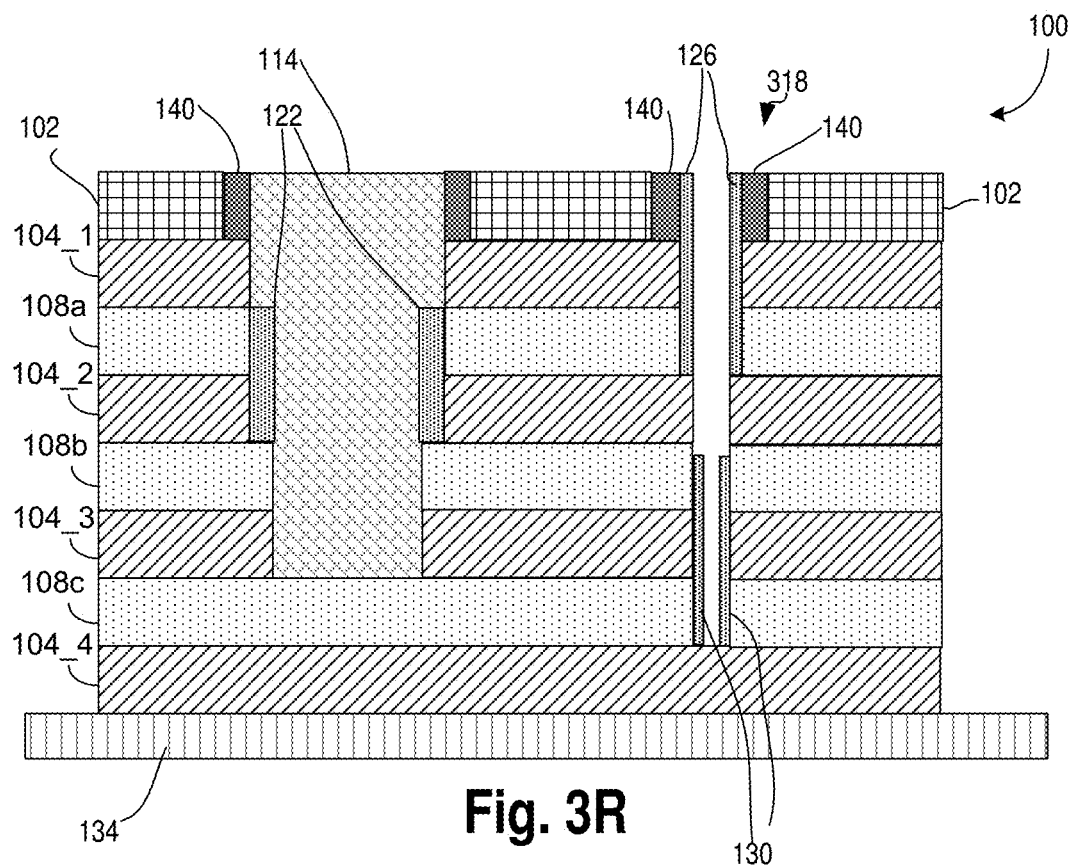
Figure 3S:
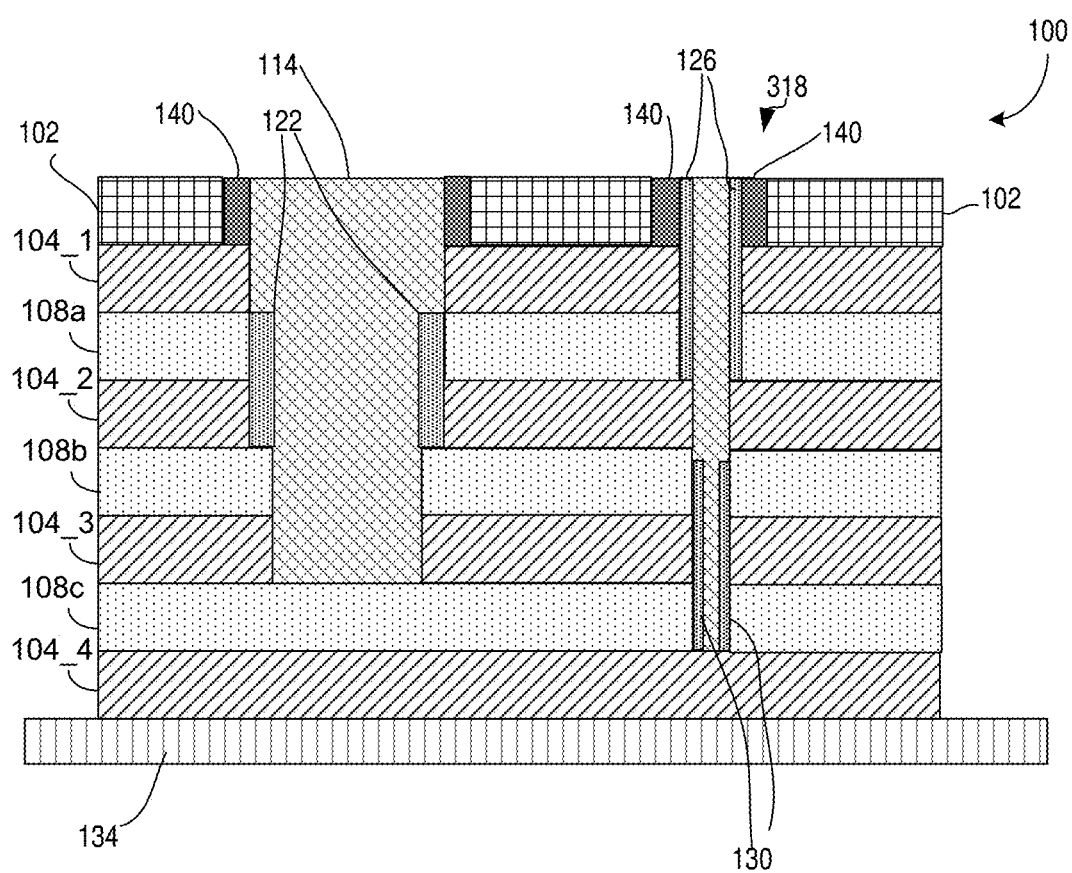

FIGS. 3A-3S illustrate an example process for forming the MIM 100 of FIG. 1, according to some embodiments. For example, FIGS. 3A-3S are cross-sectional views of the MIM 100 evolving as example operations for formation of the MIM 100 are performed.

Referring to FIG. 3A, multiple interleaved and stacked conductive layers 104_1, 104_2, 104_3, 104_4 and insulating layers 108a, 108b, 108c may be formed over a substrate 134. Although not illustrated in FIG. 3A, in some embodiments, the multiple stacked layers of conductive layers 104 and insulating layers 108 are formed by lithography using patterning and etching. For example, thin films of the conductive layers 104 and insulating layers 108 may be deposited over the substrate 134, and then etched (e.g., using a single mask) to form the layers illustrated in FIG. 3A. In some embodiments, because the conductive layers 104 and insulating layers 108 are formed using a single mask, the conductive layers 104 and insulating layers 108 are of similar dimensions, as discussed with respect to FIG. 1.

Referring now to FIG. 3B, a hard mask layer 102 may be deposited on the top most conductive layer 104_1. Photoresist layer 303 comprising photoresist material may be patterned over the hard mask layer 102. In some embodiments, a diameter a1 of a first opening 314 in the photoresist layer 303 is substantially larger (e.g., double, or higher) than a diameter a2 of a second opening 318 in the photoresist layer 303.

Referring now to FIG. 3C, hark mask layer 102 exposed through the photoresist layer 303 may be etched, and the photoresist layer 303 may then be removed. Subsequently, a conformal hard mask layer 304 may be deposited in the openings 314 and 318.

In some embodiments, as the diameter a1 of the opening 314 is larger than the diameter a2 of the opening 318, the conformal hard mask layer 304 forms a ridge, recess or low depth region within the opening 314, as illustrated in FIG. 3C. Note that although the openings 314 and 318 in FIG. 3C are partially and about fully filled, respectively, with the conformal hard mask layer 304, the positions of these openings are labeled in this figure (e.g., so that openings in such positions can be labelled using the same labels 314 and 318 in subsequent figures as well).

Referring now to FIG. 3D, the conformal hard mask layer 304 may be etched. Any appropriate etching techniques may be employed, such as anisotropic dry etch, wet chemical etch, etc. The etching of FIG. 3D may result in exposure of the top most conductive layer 104_1 through the opening 314 while the opening 318 may still be filled with the conformal hard mask layer 304, as illustrated in FIG. 3D. Thus, due to the difference in the size of the openings 314 and 318 (e.g., which may eventually result in the difference in the size of the vias 114 and 118), the top most conductive layer 104_1 may be exposed through the opening 314 (and not exposed through the opening 318).

Referring now to FIGS. 3E-3F, the conductive layers 104_1 and 104_2 and the insulating layer 108a may be selectively etched through the opening 314. For example, in FIG. 3E, the conductive layer 104_1 may be partially and selectively etched through the opening 314; and in FIG. 3F, the conductive layer 104_2 and the insulating layer 108_a_ may be partially and selectively etched through the opening 314. The etching in FIG. 3E-3F may be performed using any appropriate etching technique, e.g., dry etch, wet chemical etch, etc. The etchants used may be selective to the material of the conductive layers 104 and the insulating layer 108.

Referring now to FIG. 3G, in some embodiments, spacer layer 122 is deposited on the sidewalls of the opening 314. For example, the spacer layer 122 may be deposited conformally within the opening 314 and then selectively anisotropically etched, e.g., such that the spacer layer 122 remains on the sidewalls of the opening 314. Thus, in FIG. 3G, the spacer layer 122 may be deposited on the conductive layers 104_1 and 104_2, and on the insulating layer 108_a_ within the opening 314.

FIGS. 3H-3J illustrates, in some embodiments, an example process to recess the spacer layer 122 (e.g., using sacrificial hard mask layer 322). For example, referring now to FIG. 3H, sacrificial hard mask layer 322 may be deposited on the top side of the MIM 300, such that the sacrificial hard mask layer 322 covers the openings 314 and 318. Referring to FIG. 3I, the sacrificial hard mask layer 322 may be recessed by partially removing the sacrificial hard mask layer 322, e.g., such that the remaining sacrificial hard mask layer 322 still covers sections of the spacer layer 122 adjacent to the insulating layer 108_a_ and the conductive layer 104_2 within the opening 314. Thus, the sections of the spacer layer 122 adjacent to the conductive layer 104_1 may be exposed in FIG. 3I. Referring to FIG. 3J, the exposed sections of the spacer layer 122 may be removed (e.g., by an appropriate etching operation). The sections of the spacer layer 122 covered by the sacrificial hard mask layer 322 are not removed. Subsequently, the sacrificial hard mask layer 322 may be removed, as illustrated in FIG. 3J. Thus, in FIG. 3J, the spacer layer 122 may block the conductive layer 104_2 and at least a section of the insulating layer 108_a_, without blocking the conductive layer 104_1.

Although FIG. 3H-3J illustrate selectively removing sections of the spacer layer 122 using the sacrificial hard mask layer 322, in some other embodiments, the spacer layer 122 is partially etched using another appropriate manner (e.g., an appropriate selective anisotropic etching process).

Referring now to FIG. 3K, in some embodiments, the opening 314 is further extended by selectively etching the insulating layer 108_b_ and the conductive layer 104_3. For example, initially the insulating layer 108_b_ may be etched through the opening 314 using a selective etchant that etches the insulating layer 108, but not the conductive layer 104. Subsequently, the conductive layer 104_3 may be etched through the opening 314 using a selective etchant that etches the conductive layer 104, but not the insulating layer 108. Referring now to FIG. 3L, in some embodiments, the opening 314 is filed with conductive material (e.g., an appropriate metal) and then polished, e.g., to form the via 114.

Thus, as illustrated in FIGS. 1 and 3L, the via 114 may be formed through the conductive layers 104_1, 104_2 and 104_3, and insulating layers 108_a_ and 108_b_. In some embodiments, the via 114 is coupled to (e.g., in contact with) the conductive layers 104_1 and 104_3 (e.g., with odd numbered conductive layers). In some embodiments, although the via 114 extends through the conductive layer 104_2, the via 114 is not in contact with, or connected or coupled to, the conductive layer 104_2. For example, the spacers 122 may isolate (e.g., physically and/or electrically isolate) the via 114 from the conductive layer 104_2. Thus, in some embodiments, the via 114 is coupled to the odd numbered conductive layers 104_1, 104_3, while being isolated from the even numbered conductive layers 104_2, 104_4.

Referring now to FIG. 3M, the hard mask layer 304 may be removed. The removal of the hard mask layer 304 may result in formation of the opening 318 again, and may also result in the formation of openings 319 adjacent to the top portion of the via 114, as illustrated in FIG. 3M.

Referring now to FIG. 3N, hard mask layer 140 may be deposited on the top side of the MIM 100, thereby covering at least the openings 318 and 319. Subsequently, the hard mask layer 140 may be etched partially, resulting in a recess in the hard mask layer 140 within the opening 318, as illustrated in FIG. 3N. It is to be noted that as the opening 318 is much larger than the openings 319, the etching of the hard mask layer 140 may form the recess in the opening 318 (e.g., which may expose the top most conductive layer 104_1), without forming such a recess in the openings 319.

Referring now to FIG. 3O, the top most conductive layer 104_1 and the insulating layer 108_a_ may be etched through the opening 318 using, for example, selective etchants. For example, initially the conductive layer 104_1 may be etched through the opening 318 using a selective etchant that etches the conductive layer 104, faster than the insulating layer 108. Subsequently, the insulating layer 108_a_ may be etched through the opening 318 using a selective etchant that etches the insulating layer 108 faster than the conductive layer 104.

Referring now to FIG. 3P, spacer layer 126 may be deposited on the sidewalls of the opening 318. For example, the spacer layer 126 may be conformally deposited in the opening 318 and then partially etched anisotropically, so that sections of the spacer layer 126 remains on the sidewall of the opening 318.

Referring now to FIG. 3Q, the conductive layers 104_2 and 104_3 and the insulating layer 108_b_ and 108_c_ may be etched through within the opening 318 using, for example, selective etchants, as discussed with respect to FIG. 3O.

Referring now to FIG. 3R, spacers 130 may be deposited on sections of the opening 318, e.g., such that the spacers 130 may block (e.g., block entirely) the conductive layer 104_3 from the opening 318. In an example, the spacers 130 may also block at least a part (or the entire portion) of the insulating layers 108_b_ and/or 108_c_ from the opening 318. Example formation of spacers on sections of a sidewall of an opening has been discussed, for example, with respect to FIGS. 3G-3J.

Referring now to FIG. 3S, in some embodiments, the opening 318 is filed with conductive material (e.g., an appropriate metal) and then polished, e.g., to form the via 118.

As discussed with respect to FIG. 1, the via 118 that may be formed through at least some of the conductive layers 104 and insulating layers 108. For example, the via 118 may be formed through the conductive layers 104_1, 104_2 and 104_3 (and may be in contact with, or formed through, the conductive layer 104_4), and insulating layers 108_a_, 108_b_, and 108_c_. In some embodiments, the spacers 126 isolate (e.g., physically and/or electrically isolate) the via 118 from the conductive layer 104_1, and the spacers 130 may isolate (e.g., physically and/or electrically isolate) the via 118 from the conductive layer 104_3. For example, the spacers 122, 130 may act as blocking layers to block or isolate the via 114 from the odd numbered conductive layers 104_1 and 104_3, respectively. Thus, in some embodiments, the via 118 is coupled to the even numbered conductive layers 104_2, 104_4, while being isolated from the odd numbered conductive layers 104_1, 104_3.

As discussed herein, the conductive layers 104 need not be offset (e.g., may be aligned to each other, and may have similar length and width), e.g., as a single mask may be used to form the stacks of conductive layers 104 and insulating layers 108. Using a single mask to form the stacks of conductive layers 104 and insulating layers 108 may result in cost, time and/or chip area improvements.

Figure 4:
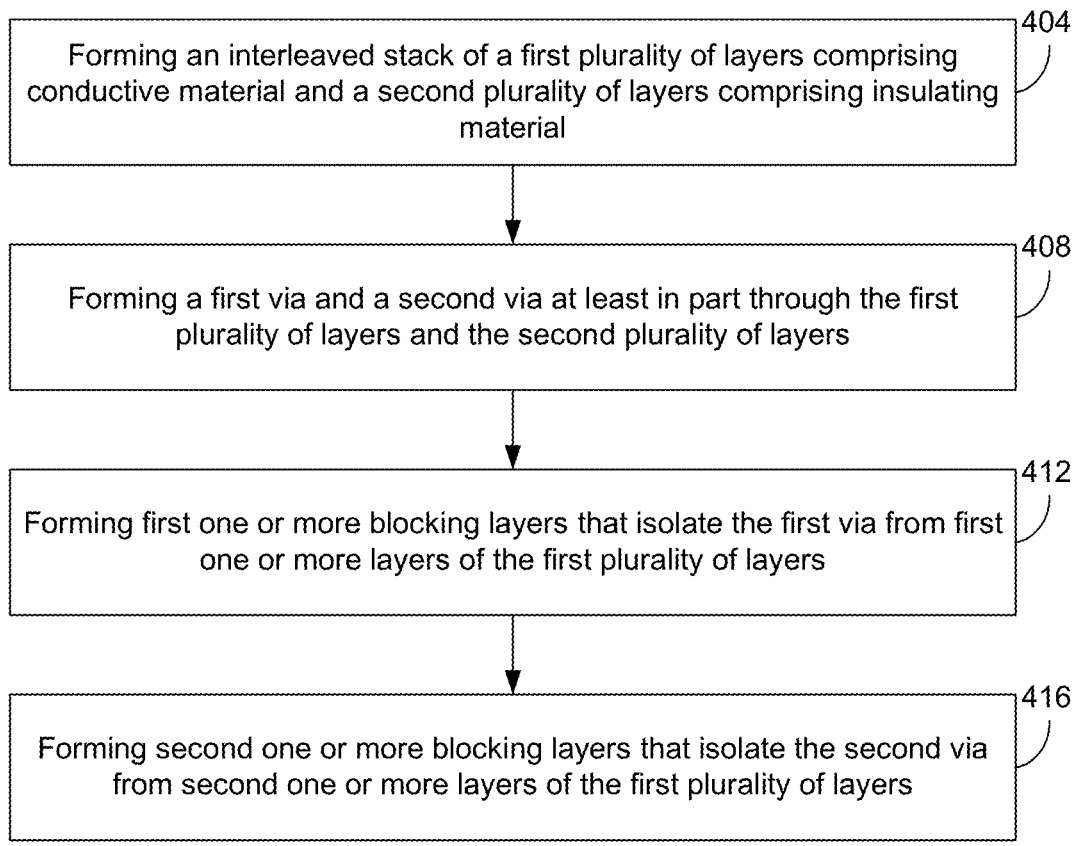
FIG. 4 is flow diagrams illustrating a method of forming a MIM (e.g., the MIM of FIG. 1), according to some embodiments.

FIG. 4 is flow diagrams illustrating a method 400 of forming the MIM 100 of FIG. 1, according to some embodiments. Although the blocks in the flowchart with reference to FIG. 4 are shown in a particular order, the order of the actions can be modified. Thus, the illustrated embodiments can be performed in a different order, and some actions/blocks may be performed in parallel. Some of the blocks and/or operations listed in FIG. 4 may be optional in accordance with certain embodiments. The numbering of the blocks presented is for the sake of clarity and is not intended to prescribe an order of operations in which the various blocks must occur.

In some embodiments, the method 400 includes, at 404, forming an interleaved stack of a first plurality of layers (e.g., conductive layers 104) including conductive material and a second plurality of layers (e.g., insulating layers 108) including insulating material. At 408, a first via (e.g., via 114) and a second via (e.g., via 118) may be formed at least in part through the first plurality of layers and the second plurality of layers. At 412, first one or more blocking layers (e.g., spacers 122) that isolate the first via from first one or more layers (e.g., conductive layer 104_2) of the first plurality of layers may be formed. At 416, second one or more blocking layers (e.g., spacers 126, 130) that isolate the second via from second one or more layers (e.g., conductive layer 104_1, 104_3) of the first plurality of layers may be formed.

Figure 5:
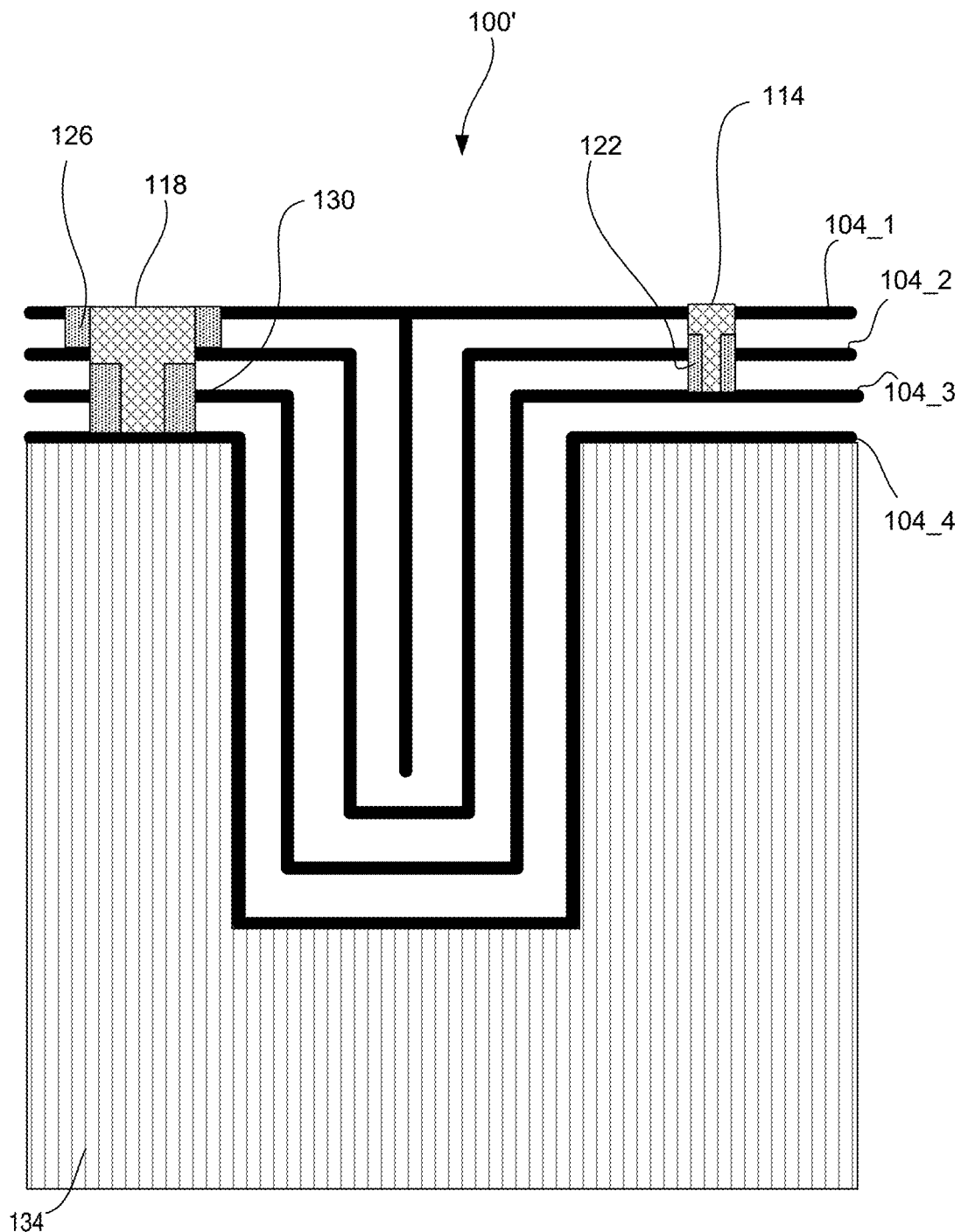
FIG. 5 illustrates another MIM including a first via coupled to odd numbered conductive layers, and a second via coupled to even numbered conductive layers, according to some embodiments.

Although FIGS. 1 and 3A-3S illustrate an example structure of the MIM 100, the MIM 100 may have any other appropriate structure. For example, FIG. 5 illustrates a MIM 100' including the first via 114 coupled to odd numbered conductive layers 104_1, 104_3, and the second via 118 coupled to even numbered conductive layers 104_2, 104_4, according to some embodiments. In an example, the MIM 100' may be implemented in an Enhanced Dynamic Random Access Memory (eDRAM) or another appropriate component, e.g., as a capacitor device. The non-linear structure of the conductive layers 104 in the MIM 100' may increase the capacitance per unit area. Formation or further details of the MIM 100' may be apparent to those skilled in the art, e.g., based on the MIM 100 of FIGS. 1-3S, and hence, will not be discussed in further details herein.

Although various embodiments discussed with respect to various figures includes a device comprising four conductive layers, in some embodiments, the principles of this disclosure can be applied to form a MIM including N number of conductive layers 104, where N can be 2, 3, 4, 5, or any appropriate higher integer (e.g., N=4 in FIG. 1). Thus, in an example, N≥2. Merely as an example, a MIM may have two conductive layers, e.g., a stack of an upper layer and a lower layer including conductive material, interleaved with a middle layer comprising insulating material. The MIM may include a first via and a second via (e.g., where the vias include conductive material). The first via may be in contact with the upper layer and isolated the lower layer. The second via may extend through the upper layer and the middle layer, and may be in contact with the lower layer. The second via may be isolated from the upper layer by a spacer comprising a dielectric material, the spacer lining a sidewall of the upper layer. The structure and method of forming of such a MIM would be evident to those skilled in the art from the discussion herein with respect to the four conductive layer MIM.

Figure 6:
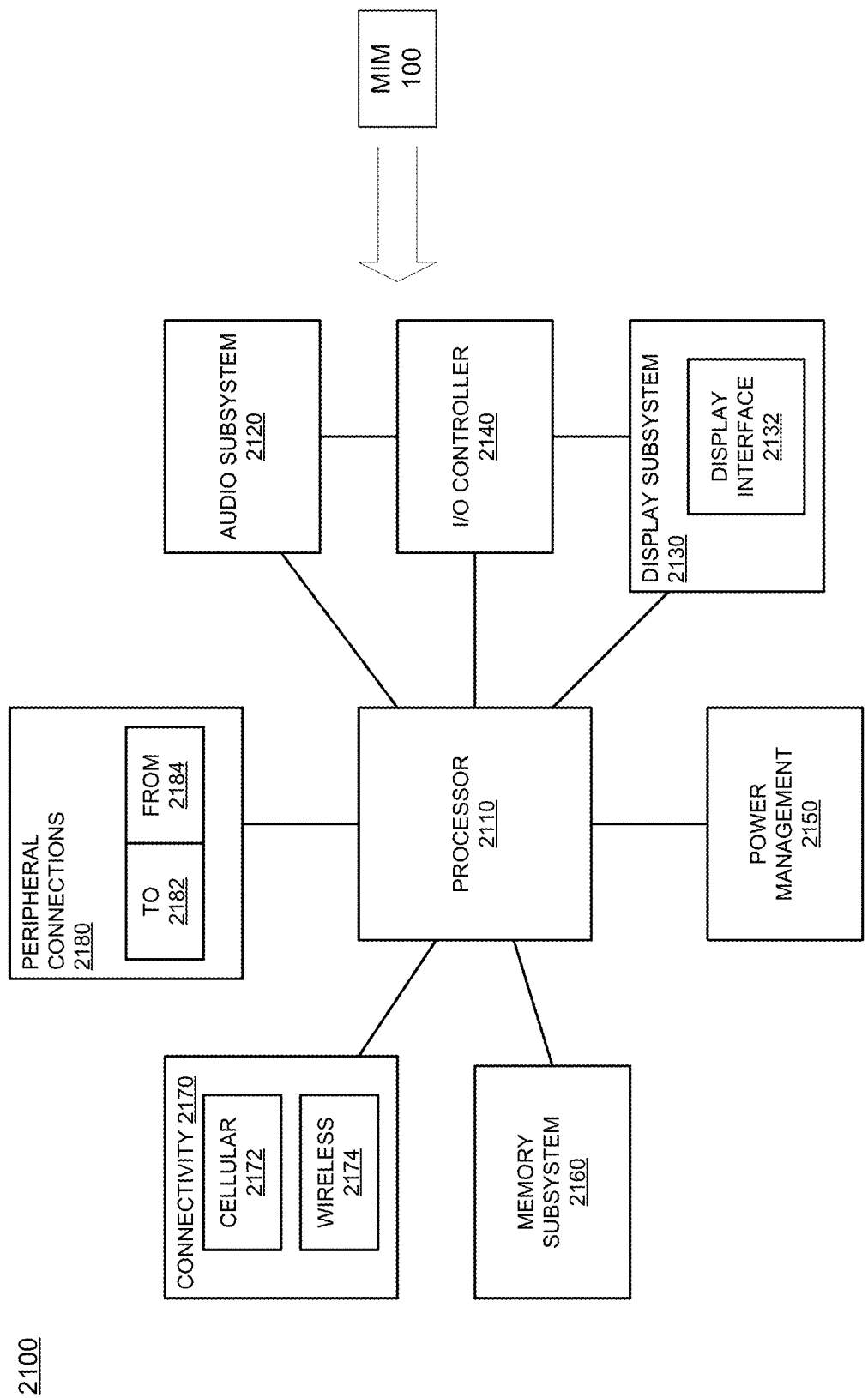
FIG. 6 illustrates a computing device or a SoC (System-on-Chip) including a capacitor formed using a MIM discussed in FIGS. 1-5, according to some embodiments.

FIG. 6 illustrates a computing device or a SoC (System-on-Chip) 2100 including a capacitor formed using a MIM (e.g., MIM 100 or MIM 100') discussed in FIGS. 1-5, according to some embodiments. It is pointed out that those elements of FIG. 6 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the MIM 100 (or MIM 100') may be used as a capacitor in any appropriate component of the computing device 2100. The MIM 100 may be formed, e.g., as discussed with respect to FIGS. 3A-4. In some embodiments, the MIM 100 (or MIM 100') may be used for any appropriate application of the computing device 2100, e.g., where a capacitor is to be used.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following example clauses pertain to further embodiments. Specifics in the example clauses may be used anywhere in one or more embodiments. All optional features of the apparatus described herein may also be implemented with respect to a method or process.

Example 1

An apparatus comprising: a stack of a first plurality of layers comprising conductive material interleaved with a second plurality of layers comprising insulating material, wherein the first plurality of layers comprises an upper layer and lower layer; a first via comprising conductive material, wherein the first via extends through at least a portion of the stack, wherein the first via is in contact with the upper layer and the lower layer; and a second via comprising conductive material, wherein the second via extends through at least a portion of the stack, wherein the second via is isolated from the upper layer and lower layer.

Example 2

The apparatus of example 1 or any other example, wherein the first plurality of layers comprises: a middle layer between the upper layer and the lower layer, wherein the first via is isolated from the middle layer, and wherein the second via is in contact with the middle layer.

Example 3

The apparatus of example 2 or any other example, wherein: the first via extends through at least the upper layer and the middle layer; and the second via extends through at least the upper layer, the middle layer, and the lower layer.

Example 4

The apparatus of example 2 or any other example, wherein the first via is isolated from the middle layer by a spacer comprising a dielectric material, the spacer lining a sidewall of the middle layer.

Example 5

The apparatus of example 4 or any other example, wherein the second via is isolated from the upper layer by a second spacer comprising a dielectric material, the second spacer between a sidewall of the upper layer and a first portion of the second via that extends through the upper layer.

Example 6

The apparatus of example 5 or any other example, wherein: the lower layer is between the middle layer and a bottom layer of the first plurality of layers; the second via is in contact with the bottom layer; and the second via is isolated from the lower layer by a third spacer comprising a dielectric material, the third spacer between a sidewall of the lower layer and a second portion of the second via that extends through the lower layer.

Example 7

The apparatus of example 6 or any other example, wherein: the second via has a third portion that extends through the middle layer; the second via has the second portion that extends through the lower layer; and a diameter of the second portion of the second via is smaller than a diameter of the third portion of the second via by at least twice a thickness of the third spacer.

Example 8

The apparatus of example 6 or any other example, wherein: the second via has the first portion that extends through the upper layer; the second via has a third portion that extends through the middle layer; and a diameter of the third portion of the second via is smaller than a diameter of the first portion of the second via by at least twice a thickness of the second spacer.

Example 9

The apparatus of example 4 or any other example, wherein: the first via has a first portion with a first diameter that extends through the upper layer; the first via has a second portion with a second diameter that extends through the middle layer; and the second diameter is smaller than the first diameter by at least twice a thickness of the first spacer.

Example 10

The apparatus of any of examples 1-9 or any other example, wherein: the first via has a first portion with a first diameter that extends through the upper layer; the second via has a second portion with a second diameter that extends through the upper layer; and the first diameter is at least twice the second diameter.

Example 11

The apparatus of any of examples 1-9 or any other example, wherein the apparatus is a capacitor with a first terminal comprising the first via, and the second terminal comprising the second via.

Example 12

A system comprising: a memory to store instructions; and a processor coupled to the memory, the processor to execute the instructions, wherein one of the memory, the processor, or another component of the system comprises a capacitor comprising: a first plurality of layers comprising conductive material interleaved with a second plurality of layers comprising insulating material, the first plurality of layers and the second plurality of layers arranged in a stack, a first via extending through at least a portion of the stack and in contact with a first subset of the first plurality of layers, and a second via extending through at least a portion of the stack and in contact with a second subset of the first plurality of layers.

Example 13

The system of example 12 or any other example, further comprising: first one or more spacers to isolate the first via from the second subset of the first plurality of conductive layers; and second one or more spacers to isolate the second via from the first subset of the first plurality of conductive layers.

Example 14

The system of example 13 or any other example, wherein: the first via comprises a first portion that extends through a first conductive layer of the second subset of the first plurality of conductive layers; and the first one or more spacers comprises a first spacer between a sidewall of the first conductive layer and the first portion of the first via.

Example 15

A method comprising: forming a stack of a first plurality of layers comprising conductive material interleaved with a second plurality of layers comprising insulating material; forming a first hard mask layer over the stack, the first hard mask layer comprising a first opening and a second opening; conformally depositing a second hard mask layer over the first hard mask layer; selectively etching the second hard mask layer such that the stack is exposed through the first opening in the second hard mask layer, wherein the second hard mask layer covers the second opening after the selective etching of the second hard mask layer; and extending the first opening through at least a portion of the stack, without extending the second opening.

Example 16

The method of example 15 or any other example, wherein the first plurality of layers comprises at least an upper layer, a lower layer, and a middle layer between the upper layer and the lower layer, and wherein the method further comprises: forming one or more spacers lining a portion of a sidewall of the first opening such that the one or more spacers isolate the first opening from the middle layer.

Example 17

The method of example 16 or any other example, wherein forming the one or more spacers lining the portion of the sidewall of the first opening comprises: depositing a spacer layer lining the sidewall of the first opening; and selectively removing the spacer layer, such that the one or more spacers line the portion of the sidewall of the first opening.

Example 18

The method of example 16 or any other example, further comprising: further extending the first opening, subsequent to forming the one or more spacers, such that the first opening extends through the upper layer and the middle layer, and is at least in contact with the lower layer.

Example 19

The method of example 18 or any other example, further comprising: depositing conductive material in the first opening, subsequent to further extending the first opening, to form a first via in the first opening, such that the one or more spacers isolate the first via from the middle layer, wherein the first via is coupled to the upper layer and the lower layer.

Example 20

The method of example 15 or any other example, further comprising: forming a first via in the first opening; removing the second hard mask layer; conformally depositing a third hard mask layer over the first hard mask layer; selectively etching the third hard mask layer such that the stack is exposed through the second opening in the third hard mask layer; and extending the second opening through at least a portion of the stack.

Example 21

The method of example 20 or any other example, wherein the first plurality of layers comprises at least an upper layer, a lower layer, and a middle layer between the upper and lower layers, and wherein the method further comprises: forming one or more spacers lining a portion of a sidewall of the second opening, wherein the one or more spacers are to isolate the second opening from the upper layer; and further extending the second opening, subsequent to forming the first one or more spacers, such that the second opening extends through the upper layer, the middle layer and the lower layer.

Example 22

The method of example 21 or any other example, wherein the first plurality of layers comprises a bottom layer such that the lower layer is between the middle layer and the bottom layer, wherein the second opening is further extended up to at least the bottom layer, wherein the one or more spacers comprises first one or more spacers, and wherein the method further comprises: forming second one or more spacers lining another portion of the sidewall of the second opening, wherein the second one or more spacers are to isolate the second opening from the lower layer.

Example 23

The method of example 22 or any other example, further comprising: depositing conductive material in the second opening, subsequent to forming the second one or more spacers, to form a second via in the second opening.

Example 24

An apparatus comprising: a stack of an upper layer and a lower layer comprising conductive material interleaved with a middle layer comprising insulating material; a first via comprising conductive material, wherein the first via is in contact with the upper layer and isolated the lower layer; and a second via comprising conductive material, wherein the second via extends through the upper layer and the middle layer and is in contact with the lower layer, and wherein the second via is isolated from the upper layer.

Example 25

The apparatus of example 24 or any other example, wherein the second via is isolated from the upper layer by a spacer comprising a dielectric material, the spacer lining a sidewall of the upper layer.

Example 26

An apparatus comprising: means for performing the method of any of the examples 15-23 or any other example.

Example 27

An apparatus comprising: means for forming a stack of a first plurality of layers comprising conductive material interleaved with a second plurality of layers comprising insulating material; means for forming a first hard mask layer over the stack, the first hard mask layer comprising a first opening and a second opening; means for conformally depositing a second hard mask layer over the first hard mask layer; means for selectively etching the second hard mask layer such that the stack is exposed through the first opening in the second hard mask layer, wherein the second hard mask layer covers the second opening after the selective etching of the second hard mask layer; and means for extending the first opening through at least a portion of the stack, without extending the second opening.

Example 28

The apparatus of example 27 or any other example, wherein the first plurality of layers comprises at least an upper layer, a lower layer, and a middle layer between the upper layer and the lower layer, and wherein the apparatus further comprises: means for forming one or more spacers lining a portion of a sidewall of the first opening such that the one or more spacers isolate the first opening from the middle layer.

Example 29

The apparatus of example 28 or any other example, wherein the means for forming the one or more spacers lining the portion of the sidewall of the first opening comprises: means for depositing a spacer layer lining the sidewall of the first opening; and means for selectively removing the spacer layer, such that the one or more spacers line the portion of the sidewall of the first opening.

Example 30

The apparatus of example 28 or any other example, further comprising: means for further extending the first opening, subsequent to forming the one or more spacers, such that the first opening extends through the upper layer and the middle layer, and is at least in contact with the lower layer.

Example 31

The apparatus of example 30 or any other example, further comprising: means for depositing conductive material in the first opening, subsequent to further extending the first opening, to form a first via in the first opening, such that the one or more spacers isolate the first via from the middle layer, wherein the first via is coupled to the upper layer and the lower layer.

Example 32

The apparatus of example 27 or any other example, further comprising: means for forming a first via in the first opening; means for removing the second hard mask layer; means for conformally depositing a third hard mask layer over the first hard mask layer; means for selectively etching the third hard mask layer such that the stack is exposed through the second opening in the third hard mask layer; and means for extending the second opening through at least a portion of the stack.

Example 33

The apparatus of example 32 or any other example, wherein the first plurality of layers comprises at least an upper layer, a lower layer, and a middle layer between the upper and lower layers, and wherein the apparatus further comprises: means for forming one or more spacers lining a portion of a sidewall of the second opening, wherein the one or more spacers are to isolate the second opening from the upper layer; and means for further extending the second opening, subsequent to forming the first one or more spacers, such that the second opening extends through the upper layer, the middle layer and the lower layer.

Example 34

The apparatus of example 33 or any other example, wherein the first plurality of layers comprises a bottom layer such that the lower layer is between the middle layer and the bottom layer, wherein the second opening is further extended up to at least the bottom layer, wherein the one or more spacers comprises first one or more spacers, and wherein the apparatus further comprises: means for forming second one or more spacers lining another portion of the sidewall of the second opening, wherein the second one or more spacers are to isolate the second opening from the lower layer.

Example 35

The apparatus of example 34 or any other example, further comprising: means for depositing conductive material in the second opening, subsequent to forming the second one or more spacers, to form a second via in the second opening.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:
1. An apparatus comprising:
a stack of a first plurality of layers comprising conductive material interleaved with a second plurality of layers comprising insulating material, wherein the first plurality of layers has substantially the same composition and comprises an upper layer, a middle layer, and a lower layer;

a first via comprising conductive material, wherein the first via extends through at least a portion of the stack, and wherein the first via is in contact with the upper layer and the lower layer and isolated from the middle layer; and a second via comprising conductive material, wherein the second via extends through at least a portion of the stack, wherein the second via is in contact with the middle layer and is isolated from the upper layer and the lower layer, and wherein a diameter at a top of the first via is different from a diameter at a top of the second via.

2. The apparatus of claim 1, wherein:
the first via extends through at least the upper layer and the middle layer; and
the second via extends through at least the upper layer, the middle layer, and the lower layer.

3. The apparatus of claim 1, wherein the first via is isolated from the middle layer by a dielectric material on a sidewall of the middle layer.

4. The apparatus of claim 3, wherein the second via is isolated from the upper layer by a dielectric material between a sidewall of the upper layer and a first portion of the second via that extends through the upper layer.

5. The apparatus of claim 4, wherein:
the lower layer is between the middle layer and a bottom layer of the first plurality of layers;
the second via is in contact with the bottom layer; and
the second via is isolated from the lower layer by a dielectric material between a sidewall of the lower layer and a second portion of the second via that extends through the lower layer.

6. The apparatus of claim 5, wherein:
the second via has a third portion that extends through the middle layer;
the second via has the second portion that extends through the lower layer; and
a diameter of the second portion of the second via is smaller than a diameter of the third portion of the second via by at least twice a thickness of the dielectric material.

7. The apparatus of claim 5, wherein:
the second via has the first portion that extends through the upper layer;
the second via has a third portion that extends through the middle layer; and
a diameter of the third portion of the second via is smaller than a diameter of the first portion of the second via by at least twice a thickness of the dielectric material.

8. The apparatus of claim 3, wherein:
the first via has a first portion with a first diameter that extends through the upper layer;
the first via has a second portion with a second diameter that extends through the middle layer; and
the second diameter is smaller than the first diameter by at least twice a thickness of the dielectric material.

9. The apparatus of claim 1, wherein:
the first via has a first portion with a first diameter that extends through the upper layer;
the second via has a second portion with a second diameter that extends through the upper layer; and
the first diameter is at least twice the second diameter.

10. The apparatus of claim 1, wherein the apparatus is a capacitor with a first terminal comprising the first via, and the second terminal comprising the second via.

11. A system comprising:
a memory to store instructions; and
a processor coupled to the memory, the processor to execute the instructions, wherein one of the memory, the processor, or another component of the system comprises a capacitor comprising the apparatus of claim 1.

12. The system of claim 11, further comprising:
a dielectric material to isolate the first via from a first subset of the first plurality of layers; and
a dielectric material to isolate the second via from a second subset of the first plurality of layers.

13. The system of claim 12, wherein:
the first via comprises a first portion that extends through a first conductive layer of the first subset of the first plurality of layers; and
the dielectric material is between a sidewall of the first conductive layer and the first portion of the first via.

* * * * *